(12) United States Patent
Shimizu

(10) Patent No.: US 11,424,327 B2
(45) Date of Patent: Aug. 23, 2022

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 17/191,783

(22) Filed: Mar. 4, 2021

(65) Prior Publication Data

US 2022/0085170 A1 Mar. 17, 2022

(30) Foreign Application Priority Data

Sep. 15, 2020 (JP) .............................. JP2020-155006

(51) Int. Cl.
| | |
|---|---|
| *H01L 29/16* | (2006.01) |
| *H01L 29/06* | (2006.01) |
| *H01L 21/04* | (2006.01) |
| *H01L 29/78* | (2006.01) |
| *H01L 29/66* | (2006.01) |

(52) U.S. Cl.
CPC ...... *H01L 29/1608* (2013.01); *H01L 21/0415* (2013.01); *H01L 29/0611* (2013.01); *H01L 29/66666* (2013.01); *H01L 29/7827* (2013.01)

(58) Field of Classification Search
CPC ............. H01L 29/1608; H01L 21/0415; H01L 29/0611; H01L 29/66666; H01L 29/7827; H01L 21/046; H01L 29/0856; H01L 29/41766; H01L 29/401; H01L 29/41741; H01L 29/45; H01L 29/7802
USPC ......................................................... 257/77
See application file for complete search history.

(56) References Cited

U.S. PATENT DOCUMENTS

| | | | |
|---|---|---|---|
| 4,647,404 A * | 3/1987 | Morimoto ............ | C01G 30/005 423/598 |
| 10,141,410 B2 | 11/2018 | Shimizu | |
| 10,665,682 B2 | 5/2020 | Shimizu | |
| 2008/0233285 A1* | 9/2008 | Das ................... | H01L 29/66068 427/372.2 |
| 2012/0228630 A1 | 9/2012 | Shimizu et al. | |
| 2016/0087043 A1* | 3/2016 | Shimizu ................ | H01L 21/324 257/77 |
| 2016/0087045 A1* | 3/2016 | Shimizu ................ | H01L 21/324 257/77 |
| 2017/0243948 A1* | 8/2017 | Tanaka ................ | H01L 29/7813 |

(Continued)

FOREIGN PATENT DOCUMENTS

| | | |
|---|---|---|
| JP | 2012-186324 A | 9/2012 |
| JP | 2017-126604 A | 7/2017 |

(Continued)

*Primary Examiner* — Mohammad M Hoque
(74) *Attorney, Agent, or Firm* — Oblon, McClelland, Maier & Neustadt, L.L.P.

(57) ABSTRACT

A semiconductor device of an embodiment includes an electrode; and a silicon carbide layer in contact with the electrode and including: a first silicon carbide region of n-type; and a second silicon carbide region disposed between the first silicon carbide region and the electrode, in contact with the electrode, and containing at least one oxygen atom bonded to four carbon atoms.

10 Claims, 19 Drawing Sheets

(56) References Cited

U.S. PATENT DOCUMENTS

2018/0277643 A1 9/2018 Shimizu et al.
2020/0403069 A1* 12/2020 Kimoto ............... H01L 29/4236
2021/0359098 A1 11/2021 Shimizu

FOREIGN PATENT DOCUMENTS

| JP | 2020-47668 A | 3/2020 |
| JP | 6692265 B2 | 5/2020 |
| JP | 2021-180262 A | 11/2021 |

* cited by examiner

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2020-155006, filed on Sep. 15, 2020, the entire contents of which are incorporated herein by reference.

FIELD

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for a next-generation semiconductor device. Silicon carbide has such excellent physical properties that a bandgap is three times that of silicon (Si), a breakdown field strength is about ten times that of silicon, and a thermal conductivity is about three times that of silicon. By using this characteristic, a semiconductor device having low loss and capable of being operated at a high temperature can be achieved.

In a semiconductor device using silicon carbide, when contact resistance between a contact electrode and an n-type region varies, device characteristics vary. Therefore, it is desired to achieve a semiconductor device that suppresses variation in contact resistance.

DETAILED DESCRIPTION

Figure 1:
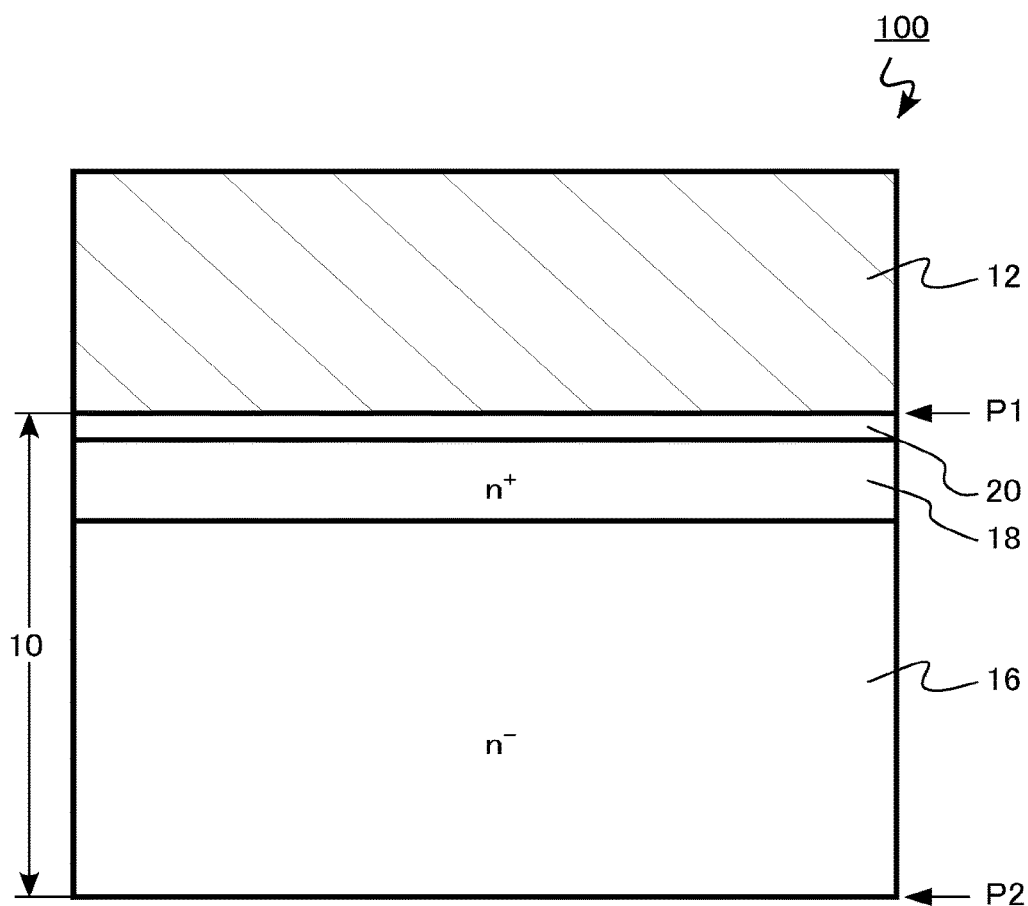
FIG. 1 is a schematic cross sectional view of a semiconductor device of a first embodiment.

A semiconductor device of an embodiment includes: an electrode; and a silicon carbide layer in contact with the electrode and including: a first silicon carbide region of n-type; and a second silicon carbide region disposed between the first silicon carbide region and the electrode, the second silicon carbide region being in contact with the electrode, and the second silicon carbide region containing at least one oxygen atom bonded to four carbon atoms.

Hereinafter, embodiments of the present disclosure will be described with reference to the drawings. Note that in the following description, the same sign will be given to the same or similar members and the like, and description of a member or the like described once will be omitted appropriately.

In the following description, each of $n^+$, n, $n^-$, $p^+$, p, and $p^-$ indicates a relative magnitude of an impurity concentration in each conductive type. That is, it is indicated that has a relatively higher n-type impurity concentration than n and that $n^-$ has a relatively lower n-type impurity concentration than n. It is indicated that $p^+$ has a relatively higher p-type impurity concentration than p and that $p^-$ has a relatively lower p-type impurity concentration than p. Note that an $n^+$ type or an $n^-$ type may be referred to simply as an n type. A $p^+$ type or a $p^-$ type may be referred to simply as a p type. Unless otherwise specified, the impurity concentration in each region is represented by, for example, a value of the impurity concentration in a central portion of each region.

The impurity concentration can be measured by, for example, secondary ion mass spectrometry (SIMS). The relative magnitude of the impurity concentration can be determined from, for example, the magnitude of a carrier concentration determined by scanning capacitance microscopy (SCM). A distance such as the width or depth of an impurity region can be determined by, for example, SIMS. A distance such as the width or depth of the impurity region can be determined from, for example, an SCM image.

The depth of the impurity region, the thickness of an insulating layer, and the like can be measured, for example, by SIMS or on an image of a transmission electron microscope (TEM).

A bonding state of an oxygen atom in the silicon carbide layer can be identified, for example, by X-ray photoelectron spectroscopy (XPS method). In addition, whether or not an oxygen atom in the silicon carbide layer is positioned at a silicon site of a crystal structure of silicon carbide can be determined by, for example, Raman spectroscopy.

First Embodiment

A semiconductor device of a first embodiment includes an electrode; and a silicon carbide layer in contact with the electrode and includes a first silicon carbide region of n-type; and a second silicon carbide region disposed between the first silicon carbide region and the electrode, the second silicon carbide region being in contact with the electrode, and the second silicon carbide region containing at least one oxygen atom bonded to four carbon atoms.

FIG. 1 is a schematic cross-sectional view of the semiconductor device of the first embodiment; The semiconductor device of the first embodiment has a contact structure 100 in which an electrode is in contact with a silicon carbide region of n-type.

The contact structure 100 includes a silicon carbide layer 10 and a contact electrode 12 (electrode). The contact electrode 12 is an example of the electrode.

The silicon carbide layer 10 includes a substrate region 16, a contact region 18 (first silicon carbide region), and an oxygen region 20 (second silicon carbide region).

The silicon carbide layer 10 is made of, for example, a single crystal of 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

Here, the term "depth" means a distance from the first plane P1 in a direction going from the first plane P1 to the second plane P2.

Hereinafter, a case where the first plane P1 of the silicon carbide layer 10 is inclined by 0 degrees or more and 10 degrees or less with respect to a silicon face and the second plane P2 is inclined by 0 degrees or more and 10 degrees or less with respect to a carbon face will be exemplified. The first plane P1 of the silicon carbide layer 10 has an off angle of 0 degrees or more and 10 degrees or less with respect to the silicon face.

The substrate region 16 is made of SiC of $n^-$ type. The substrate region 16 is disposed on a side of the second plane P2 of the silicon carbide layer 10. The substrate region 16 is in contact with the second plane P2.

The substrate region 16 contains, for example, nitrogen (N) as n-type impurities. The n-type impurity concentration in the substrate region 16 is, for example, $1 \times 10^{15}$ cm$^{-3}$ or more and $2 \times 10^{16}$ cm$^{-3}$ or less. The n-type impurity concentration in the substrate region 16 is lower than the n-type impurity concentration in the contact region 18.

The substrate region 16 has a thickness, for example, of 5 μm or more and 100 μm or less.

The contact region 18 is made of SiC of $n^+$ type. The contact region 18 is disposed between the substrate region 16 and the contact electrode 12. The contact region 18 is disposed between the substrate region 16 and the first plane P1.

The contact region 18 contains, for example, nitrogen (N) as n-type impurities. The n-type impurity concentration in the contact region 18 is, for example, $1 \times 10^{19}$ cm$^{-3}$ or more and $1 \times 10^{23}$ cm$^{-3}$ or less. The n-type impurity concentration in the contact region 18 is higher than the n-type impurity concentration in the substrate region 16.

The oxygen region 20 is made of SiC of $n^+$ type. The oxygen region 20 is disposed between the contact region 18 and the contact electrode 12. The oxygen region 20 is disposed between the contact region 18 and the first plane P1. The contact region 18 is in contact with the contact electrode 12.

The oxygen region 20 contains oxygen as impurities. A maximum concentration of oxygen in the oxygen region 20 is, for example, $1 \times 10^{17}$ cm$^{-3}$ or more and $1 \times 10^{23}$ cm$^{-3}$ or less.

The oxygen region 20 contains at least one oxygen atom bonded to four carbon atoms. The oxygen atom bonded to four carbon atoms. The oxygen region 20 may contain oxygen atoms each bonded to four carbon atoms.

The oxygen region 20 contains, for example, nitrogen (N) as n-type impurities. The n-type impurity concentration in the oxygen region 20 is, for example, $1 \times 10^{19}$ cm$^{-3}$ or more and $1 \times 10^{23}$ cm$^{3-}$ or less.

Figure 2A:
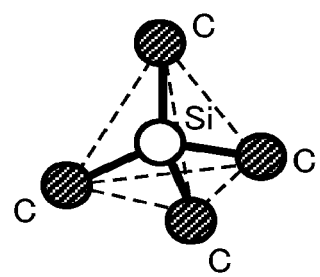
FIGS. 2A and 2B are explanatory diagrams of an oxygen region of the first embodiment.
Figure 2B:
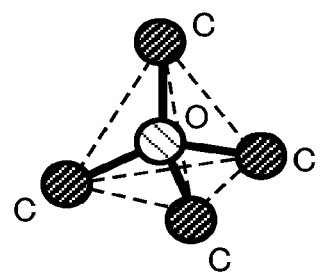

FIGS. 2A and 2B are explanatory diagrams of the oxygen region of the first embodiment. FIG. 2A is a diagram illustrating a crystal structure of silicon carbide. FIG. 2B is a diagram illustrating a structure present in the oxygen region 20.

As illustrated in FIG. 2B, there is one oxygen atom bonded to four carbon atoms in the oxygen region 20. In other words, there is one oxygen atom positioned at a silicon site of the crystal structure of silicon carbide illustrated in FIG. 2A in the oxygen region 20. In other words, the oxygen region 20 has a structure in which the silicon atom in the crystal structure of silicon carbide is replaced with one oxygen atom.

Figure 3:
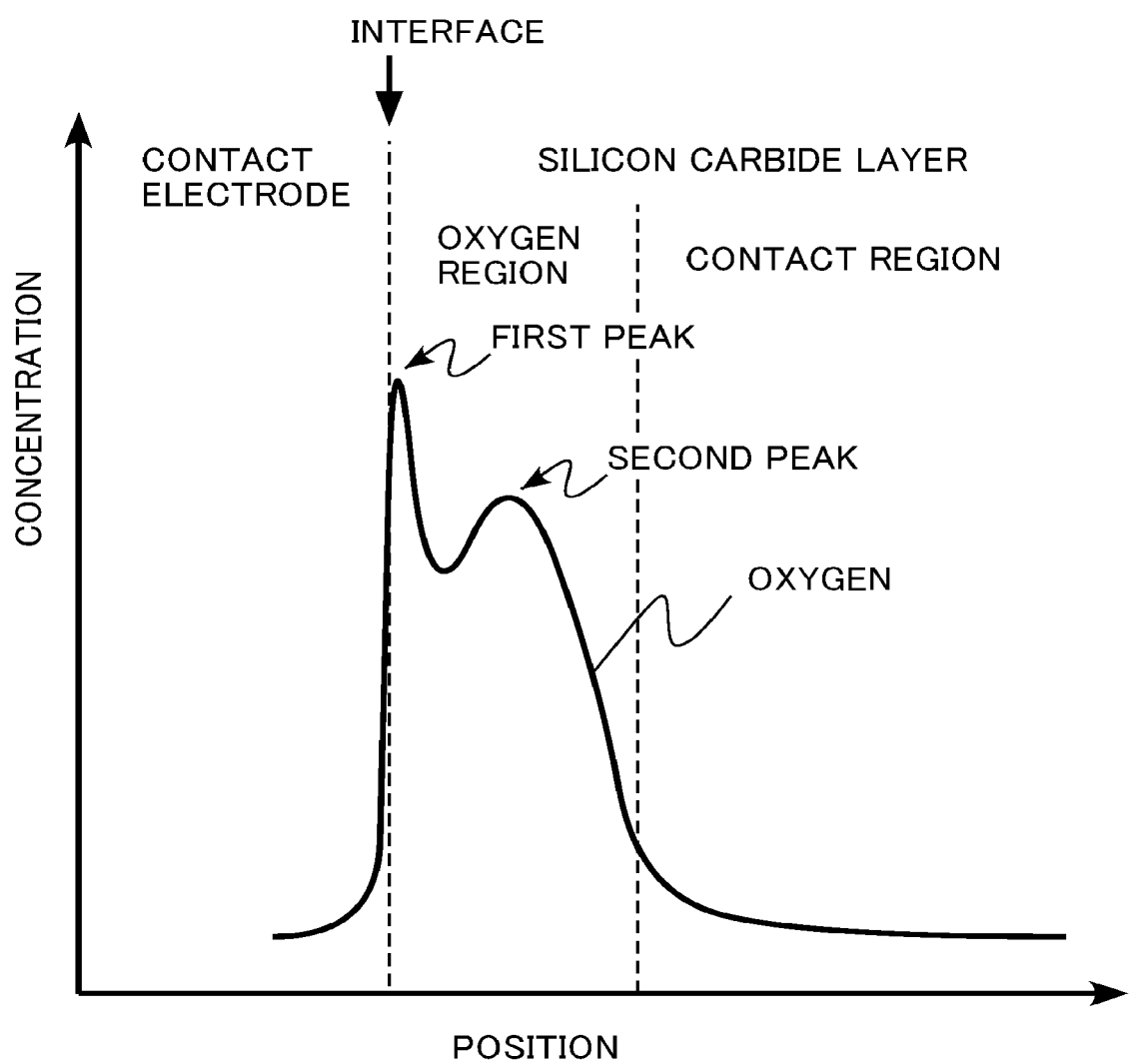
FIG. 3 is a diagram illustrating a concentration distribution of oxygen in the semiconductor device of the first embodiment.

FIG. 3 is a diagram illustrating a concentration distribution of oxygen in the semiconductor device of the first embodiment. FIG. 3 illustrates a concentration distribution of oxygen in the contact electrode 12 and the silicon carbide layer 10 in the depth direction. FIG. 3 illustrates a concentration distribution of oxygen in the contact electrode 12, the oxygen region 20, and the contact region 18 in the depth direction.

The concentration distribution of oxygen in the contact electrode 12 and the oxygen region 20 has a first peak. A distance between an interface between the contact electrode 12 and the oxygen region 20 and the first peak is 50 nm or less. In the oxygen region 20, oxygen is piled up at an interface between the contact electrode 12 and the oxygen region 20.

The oxygen concentration at the first peak is, for example, $1 \times 10^{17}$ cm$^{-3}$ or more and $1 \times 10^{23}$ cm$^{-3}$ or less.

The concentration distribution of oxygen in the contact electrode 12 and the oxygen region 20 has a second peak between the first peak and the contact region 18. The oxygen concentration at the second peak is lower than, for example, the oxygen concentration at the first peak.

The contact electrode 12 is disposed on a side of the first plane P1 of the silicon carbide layer 10. The contact electrode 12 is electrically connected to the oxygen region 20 and the contact region 18.

The contact electrode 12 is in contact with the silicon carbide layer 10. The contact electrode 12 is in contact with the oxygen region 20.

The contact electrode 12 is, for example, in ohmic-contact with the oxygen region 20. The Schottky barrier height between the contact electrode 12 and the oxygen region 20 is, for example, less than 0.15 eV. The Schottky barrier height between the contact electrode 12 and the oxygen region 20 is, for example, about 0.1 eV.

The contact electrode 12 is made of a conductor. The contact electrode 12 is made of, for example, a metal, an intermetallic compound, a metal nitride, a metal silicide, or a semiconductor.

The contact electrode 12 may have, for example, a stacked structure. The contact electrode 12 has, for example, a stacked structure of two different types of metals. The contact electrode 12 has, for example, a stacked structure of a metal silicide and a metal.

The contact electrode 12 has, for example, a stacked structure of titanium and aluminum. The contact electrode 12 contains, for example, nickel silicide. The contact electrode 12 has, for example, a stacked structure of nickel silicide and aluminum.

Next, an example of a method for manufacturing the semiconductor device of the first embodiment will be described.

In the method for manufacturing the semiconductor device of the first embodiment, first ion implantation of implanting oxygen into a silicon carbide layer having a first silicon carbide region of n-type is performed, second ion implantation of implanting carbon into the silicon carbide layer is performed, a conductive film is formed on the silicon carbide layer, and a first heat treatment is performed. After the first ion implantation and the second ion implantation and before formation of the conductive film, a second heat treatment in which the temperature is higher than that in the first heat treatment is further performed. Before the first ion implantation and the second ion implantation, an oxide film is formed on the silicon carbide layer. After the first ion implantation and the second ion implantation and before formation of the conductive film, the oxide film is removed. The temperature in the first heat treatment is 300° C. or higher and 700° C. or lower.

Figure 4:
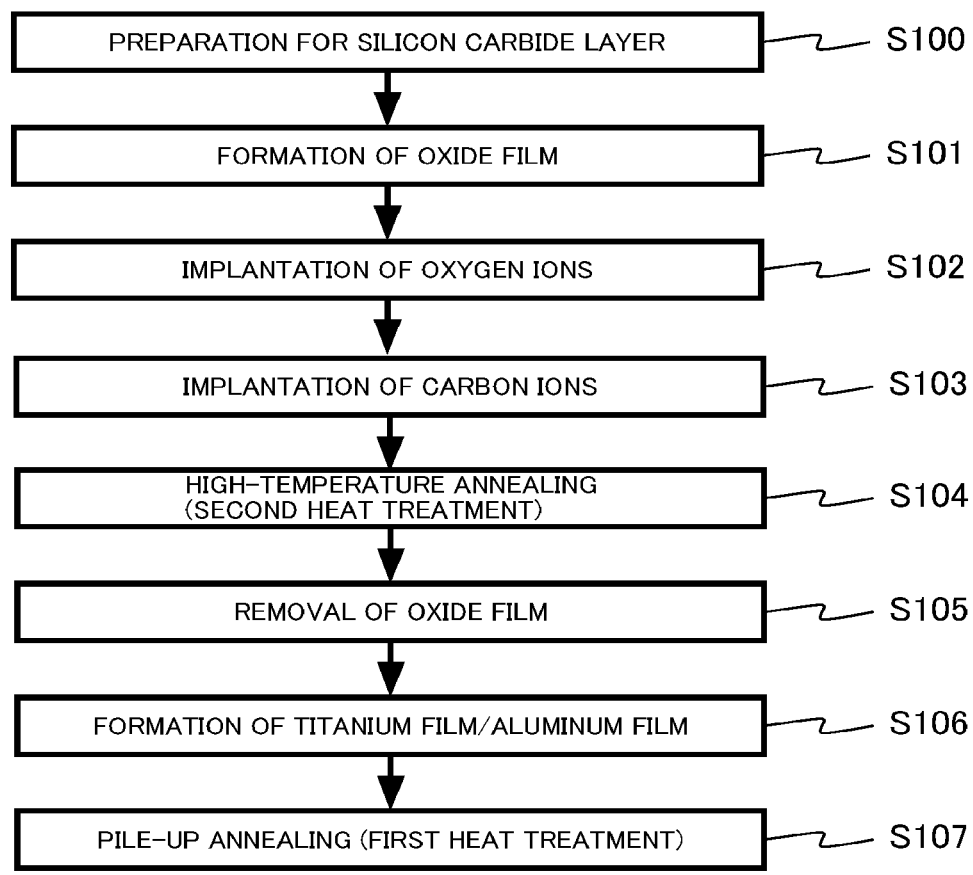
FIG. 4 is a process flow chart illustrating a method for manufacturing the semiconductor device of the first embodiment.

FIG. 4 is a process flow chart illustrating the method for manufacturing the semiconductor device of the first embodiment. FIGS. 5, 6, 7, 8, 9, 10, and 11 are explanatory diagrams of the method for manufacturing the semiconductor device of the first embodiment.

Hereinafter, a case where the contact electrode 12 has a stacked structure of titanium and aluminum will be exemplified.

As illustrated in FIG. 4, the method for manufacturing the semiconductor device includes preparation for silicon carbide layer (step S100), formation of oxide film (step S101), implantation of oxygen ions (step S102), implantation of carbon ions (step S103), high-temperature annealing (step S104), removal of oxide film (step S105), formation of titanium film/aluminum film (step S106), and pile-up annealing (step S107).

Figure 5:
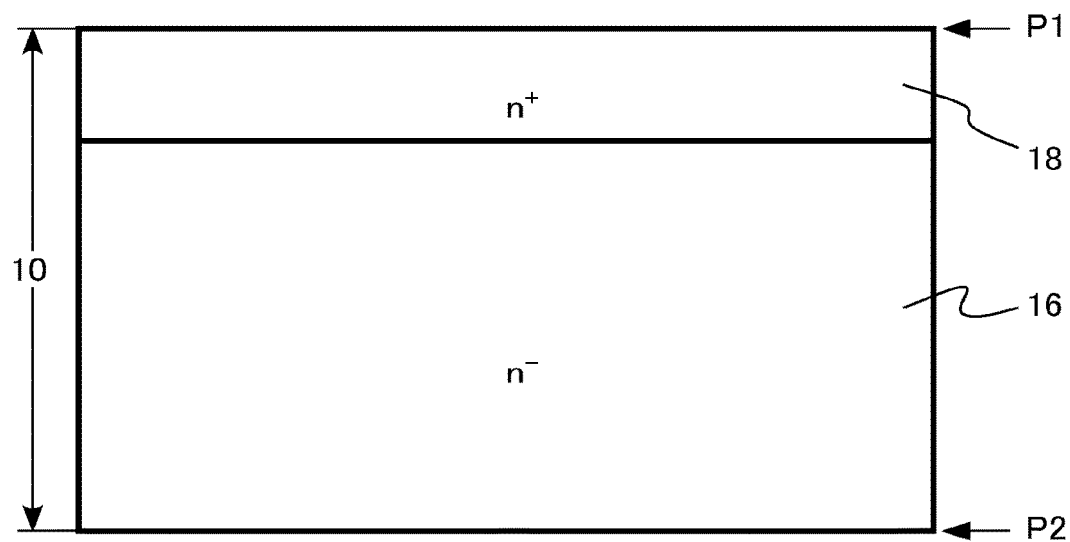
FIG. 5 is an explanatory diagram of the method for manufacturing the semiconductor device of the first embodiment.

In step S100, the silicon carbide layer 10 is prepared (FIG. 5). The silicon carbide layer 10 includes the substrate region 16 of n⁻ type and the contact region 18 of n⁺ type. The contact region 18 is formed, for example, by ion implantation on the substrate region 16. The silicon carbide layer 10 has a first plane P1 and a second plane P2.

Figure 6:
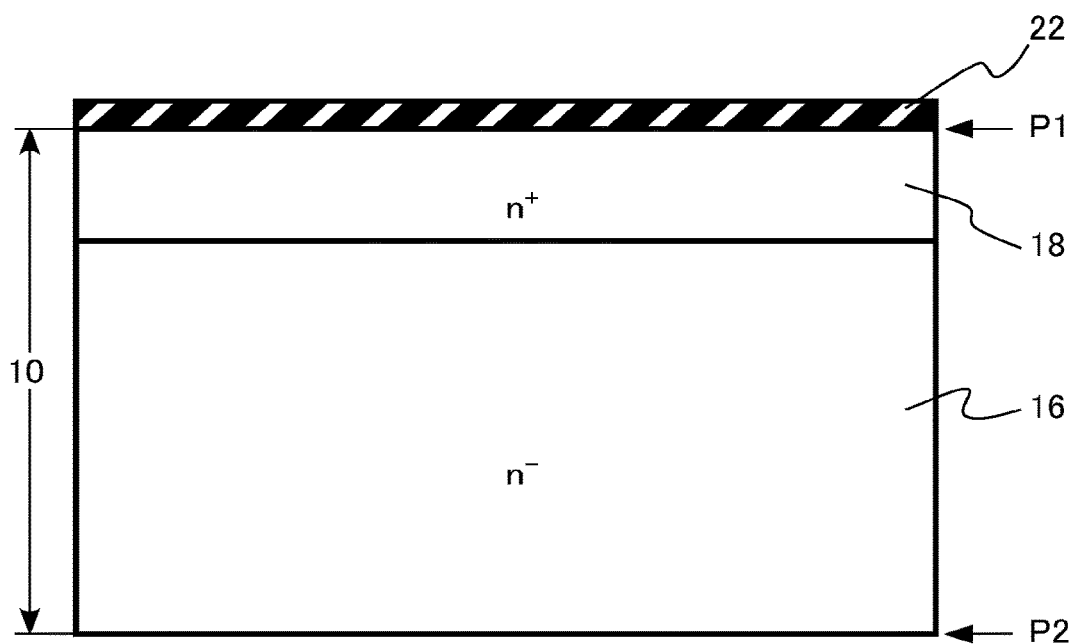
FIG. 6 is an explanatory diagram of the method for manufacturing the semiconductor device of the first embodiment.

In step S101, an oxide film 22 is formed on the silicon carbide layer 10 (FIG. 6). The oxide film 22 is formed by a chemical vapor deposition method (CVD method) or a thermal oxidation method.

Figure 7:
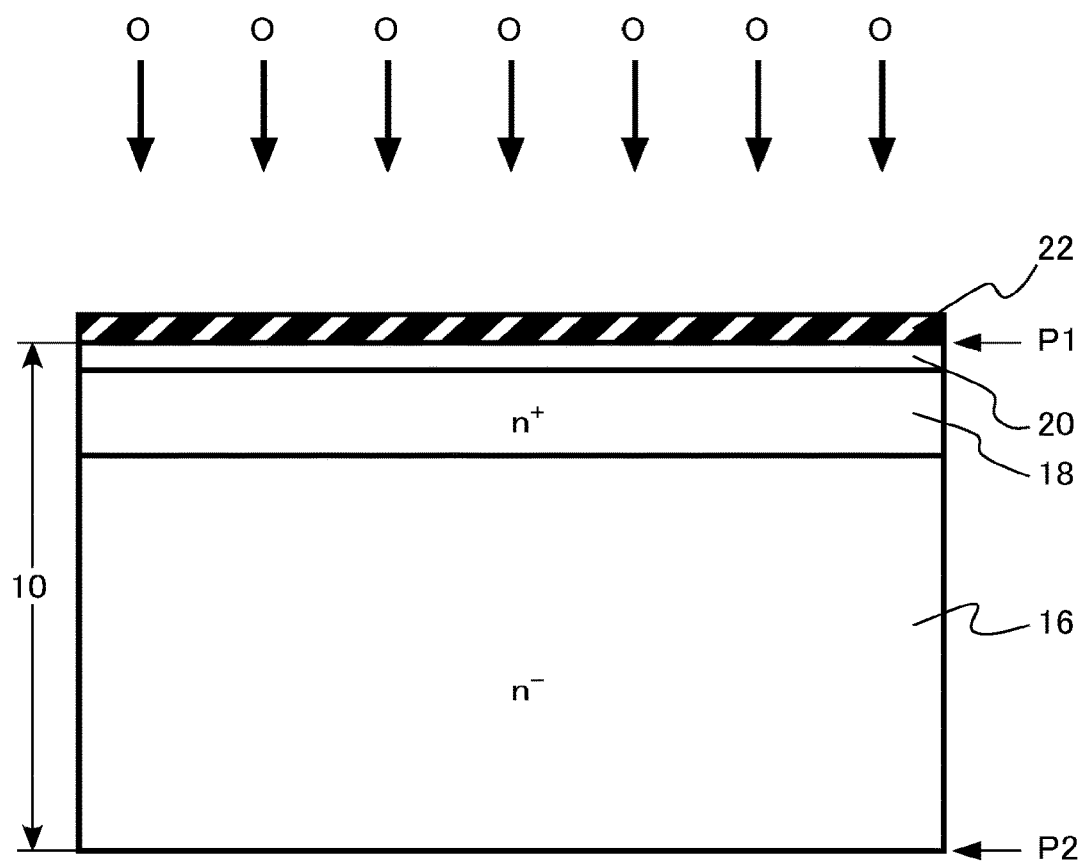
FIG. 7 is an explanatory diagram of the method for manufacturing the semiconductor device of the first embodiment.

In step S102, first ion implantation of implanting oxygen into the silicon carbide layer 10 is performed (FIG. 7). Oxygen ions that have passed through the oxide film 22 are introduced into the silicon carbide layer 10. By the ion implantation of oxygen, the oxygen-containing oxygen region 20 is formed.

Figure 8:
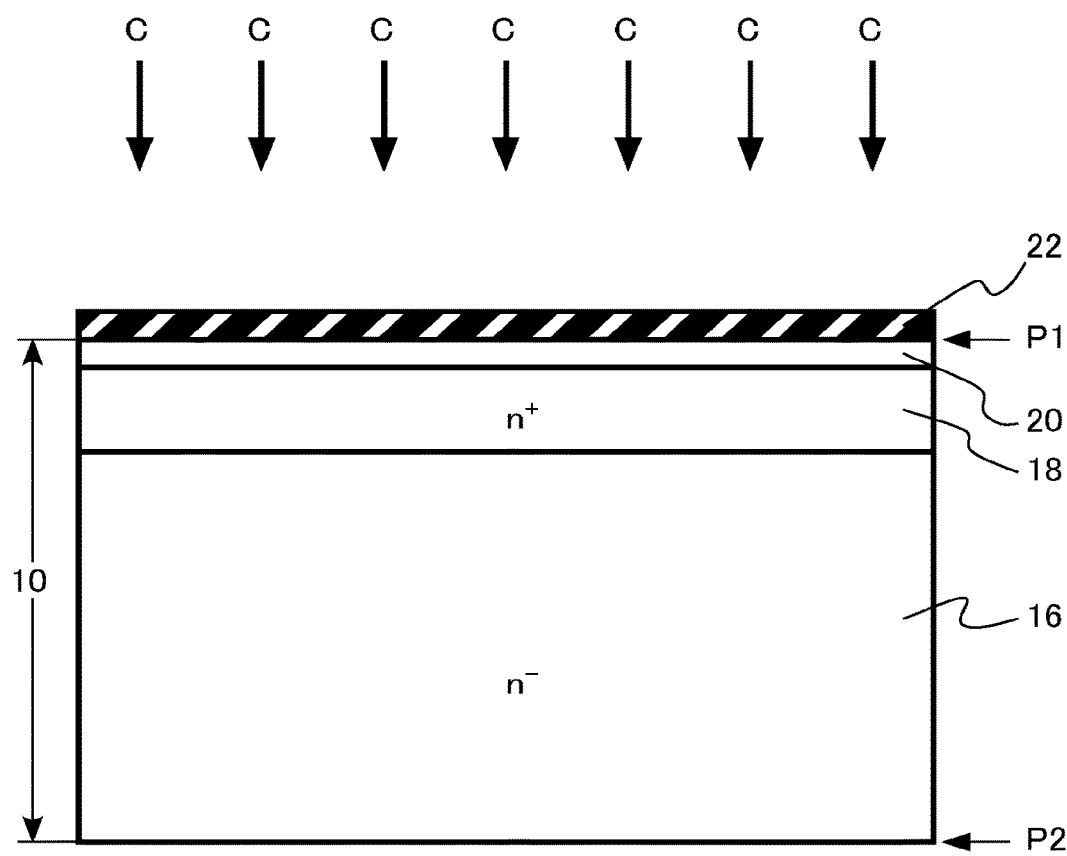
FIG. 8 is an explanatory diagram of the method for manufacturing the semiconductor device of the first embodiment.

In step S103, second ion implantation of implanting carbon into the silicon carbide layer 10 is performed (FIG. 8). Carbon ions that have passed through the oxide film 22 are introduced into the silicon carbide layer 10.

Carbon introduced into the silicon carbide layer 10 suppresses entry of an oxygen atom into a carbon site in the crystal structure of silicon carbide during high-temperature annealing to be performed later, and promotes entry of an oxygen atom into a silicon site in the crystal structure of silicon carbide.

Note that the first ion implantation and the second ion implantation are performed in arbitrary order. The second ion implantation may be performed before the first ion implantation.

Figure 9:
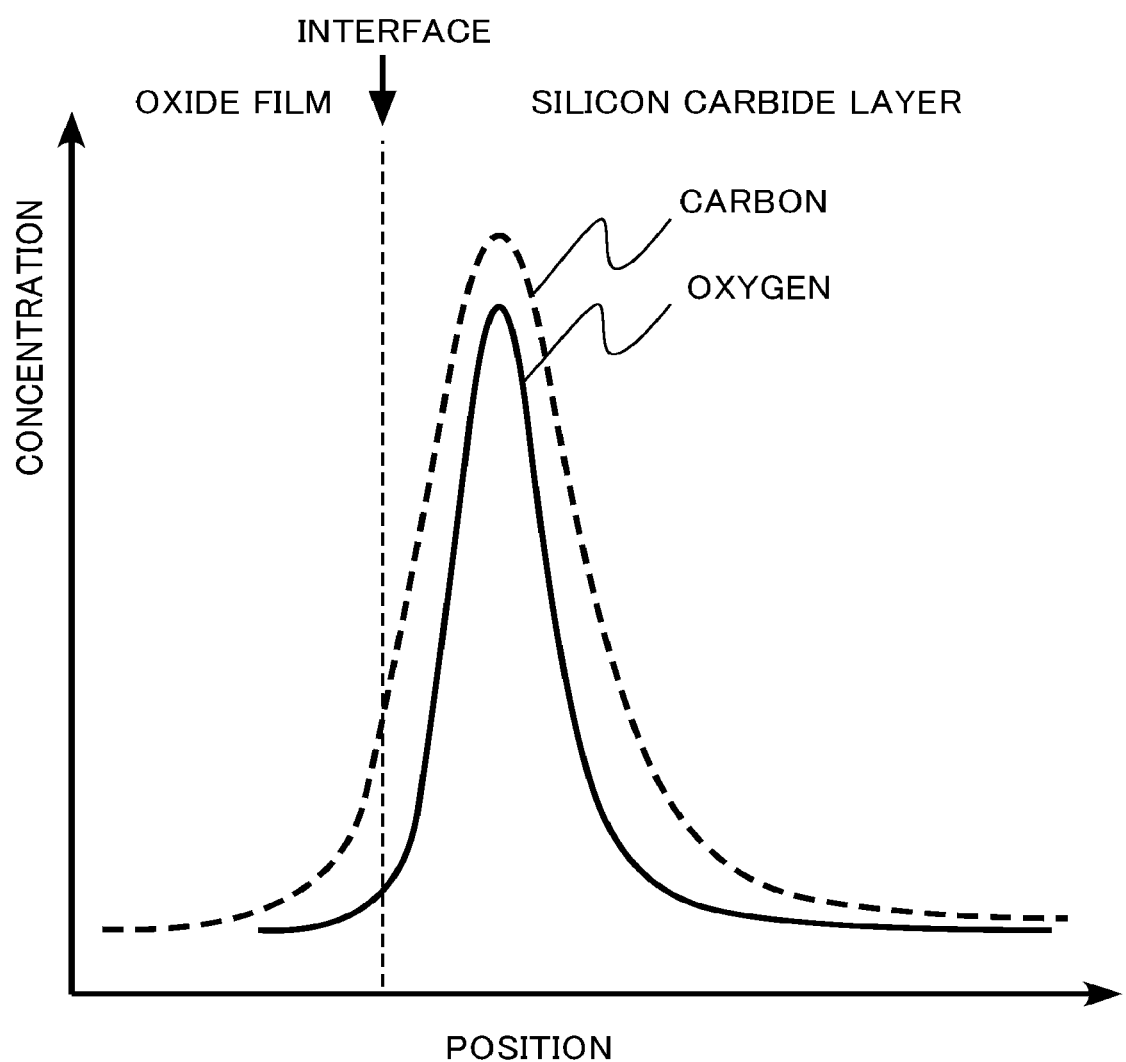
FIG. 9 is an explanatory diagram of the method for manufacturing the semiconductor device of the first embodiment.

FIG. 9 is a diagram illustrating concentration profiles of oxygen and carbon immediately after the first ion implantation and the second ion implantation are performed. The horizontal axis indicates the position of the silicon carbide layer 10 in the depth direction. The vertical axis indicates the concentration of each element.

The concentration distribution of carbon includes, for example, the concentration distribution of oxygen. For example, the concentration of carbon at any position in the depth direction is higher than the concentration of oxygen.

In step S104, high-temperature annealing is performed. High-temperature annealing is an example of the second heat treatment. By high-temperature annealing, a structure in which a silicon atom in the crystal structure of silicon carbide is replaced with one oxygen atom is formed.

High-temperature annealing is performed in an atmosphere containing, for example, argon (Ar) or nitrogen (N). High-temperature annealing is performed in an atmosphere of an inert gas such as an argon (Ar) gas.

The temperature of high-temperature annealing is higher than the temperature of pile-up annealing to be performed later, for example. The temperature of high-temperature annealing is, for example, 800° C. or higher and 1000° C. or lower.

Figure 10:
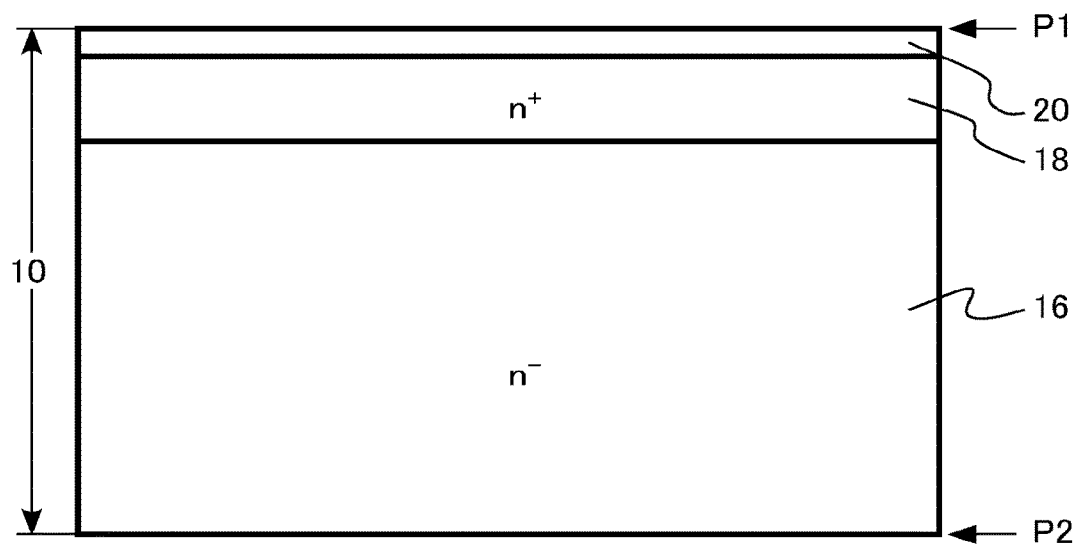
FIG. 10 is an explanatory diagram of the method for manufacturing the semiconductor device of the first embodiment.

In step S105, the oxide film 22 is removed (FIG. 10). The oxide film 22 is removed by, for example, wet etching.

Figure 11:
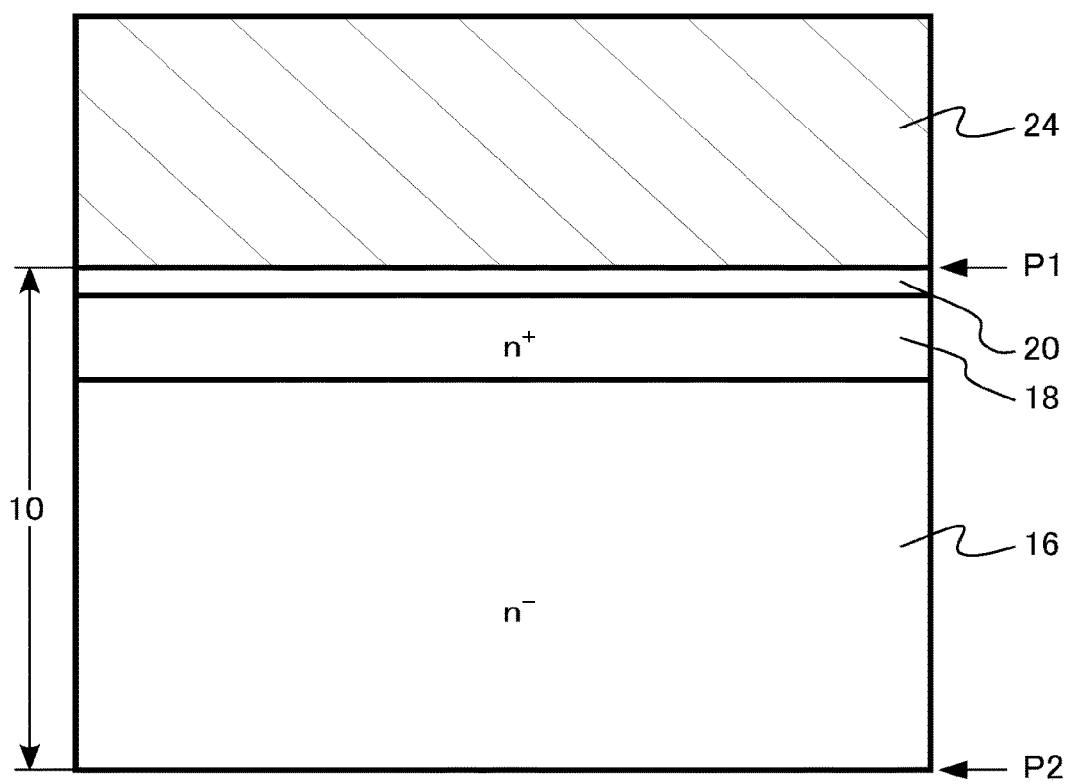
FIG. 11 is an explanatory diagram of the method for manufacturing the semiconductor device of the first embodiment.

In step S106, a stacked film 24 of a titanium film and an aluminum film is formed on the silicon carbide layer (FIG. 11). The stacked film 24 is formed by, for example, a sputtering method. The stacked film 24 is an example of the conductive film. The stacked film 24 finally becomes the contact electrode 12.

In step S107, pile-up annealing is performed. Pile-up annealing is an example of the first heat treatment. By pile-up annealing, oxygen in the oxygen region 20 is piled up at an interface between the contact electrode 12 and the oxygen region 20.

Pile-up annealing is performed in an atmosphere containing argon (Ar) or nitrogen (N), for example. Pile-up annealing is performed in an atmosphere of an inert gas such as an argon (Ar) gas.

The temperature of pile-up annealing is lower than the temperature of high-temperature annealing, for example. The temperature of pile-up annealing is, for example, 300° C. or higher and 700° C. or lower.

The contact structure 100 illustrated in FIG. 1 is manufactured by the above manufacturing method.

Next, functions and effects of the semiconductor device of the first embodiment and the method for manufacturing the semiconductor device will be described.

In a semiconductor device using silicon carbide, contact resistance between a contact electrode and an n-type region may vary. When the contact resistance varies, device characteristics vary.

For example, when a portion having a high Schottky barrier is locally generated, the contact resistance may increase. When the contact resistance increases, for example, on-resistance of the transistor is reduced. Therefore, it is desired to achieve a contact structure in which the Schottky barrier height between a contact electrode and an n-type region is low and variation in the Schottky barrier height is suppressed.

The variation in the Schottky barrier height is caused by, for example, variation in a reaction between a silicon carbide layer and an electrode.

The contact structure 100 of the first embodiment includes the oxygen region 20 in contact with the contact electrode 12 in the silicon carbide layer 10. The oxygen region 20 contains one oxygen atom bonded to four carbon atoms. By inclusion of the oxygen region 20 in the contact structure 100, the Schottky barrier is lowered and the variation in the Schottky barrier height can be suppressed. This will be described in detail below.

As a result of the first principle calculation by the inventor, when excessive carbon atoms present between lattices and an oxygen atom coexist in the crystal structure of silicon carbide, it has been clarified that a structure in which a silicon atom is replaced with one oxygen atom and the oxygen atom is bonded to four carbon atoms is energetically stable, as illustrated in FIG. 2B. That is, it has been clarified that a structure in which one oxygen atom is positioned at a silicon site of the crystal structure of silicon carbide is energetically stable.

Figure 12:
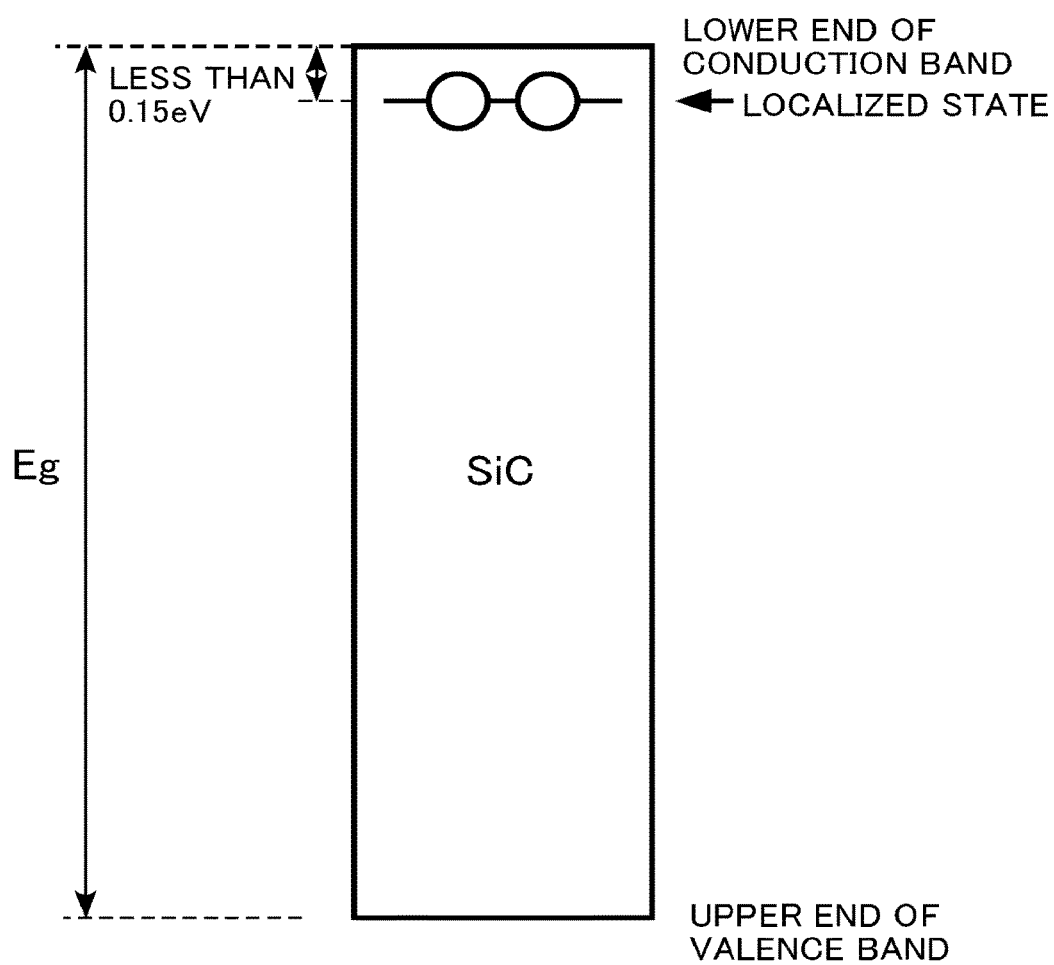
FIG. 12 is an explanatory diagram for functions and effects of the semiconductor device of the first embodiment.

FIG. 12 is an explanatory diagram for functions and effects of the semiconductor device of the first embodiment. FIG. 12 is an explanatory diagram of a localized state formed in a band gap of silicon carbide in the oxygen region 20. As illustrated in FIG. 12, when one oxygen atom is positioned at a silicon site of the crystal structure of silicon carbide, a localized state is formed on a lower end side of a conduction band.

As illustrated in FIG. 12, the localized state is formed at a position of less than 0.15 eV from the lower end of the conduction band. That is, an energy difference between the localized state and the lower end of the conduction band is less than 0.15 eV.

When there is the localized state in the oxygen region 20, electrons move between the contact electrode 12 in contact with the oxygen region 20 and the localized state. This movement of electrons fixes a Schottky barrier height between the contact electrode 12 and the oxygen region 20 at a level less than 0.15 eV. By occurrence of so-called Fermi level pinning, the Schottky barrier height between the contact electrode 12 and the oxygen region 20 is fixed at a level less than 0.15 eV.

By fixing the Schottky barrier height at a low level of less than 0.15 eV, the contact resistance of the contact structure 100 is reduced, and ohmic characteristics can be achieved. In addition, variation in the Schottky barrier height of the contact resistance of the contact structure 100 is suppressed, and variation in the contact resistance is suppressed.

In addition, by formation of the localized state in the bandgap and occurrence of Fermi level pinning, the Schottky barrier height is fixed at a level less than 0.15 eV regardless of a material of the contact electrode 12. Therefore, the material of the contact electrode 12 can be arbitrarily selected.

A maximum concentration of oxygen in the oxygen region 20 is preferably $1 \times 10^{17}$ cm$^{-3}$ or more, more preferably $2 \times 10^{18}$ cm$^{-3}$ or more, still more preferably $3 \times 10^{19}$ cm$^{-3}$ or more, and most preferably $3 \times 10^{20}$ cm$^{-3}$ or more from a viewpoint of forming a sufficient amount of localized state in the oxygen region 20 and stably fixing the Schottky barrier height in very low height.

The concentration distribution of oxygen in the contact electrode 12 and the oxygen region 20 has a first peak. The oxygen concentration at the first peak is preferably $1 \times 10^{17}$ cm$^{-3}$ or more, more preferably $2 \times 10^{18}$ cm$^{-3}$ or more, still more preferably $3 \times 10^{19}$ cm$^{-3}$ or more, and most preferably $3 \times 10^{20}$ cm$^{-3}$ or more.

A maximum concentration of oxygen in the oxygen region 20 is preferably $1 \times 10^{23}$ cm$^{-3}$ or less, more preferably $5 \times 10^{22}$ cm$^{-3}$ or less, still more preferably $1 \times 10^{22}$ cm$^{-3}$ or less, and most preferably $5 \times 10^{21}$ cm$^{-3}$ or less from a viewpoint of easy formation of the oxygen region 20.

A distance between an interface between the contact electrode 12 and the oxygen region 20 and the first peak is preferably 50 nm or less, more preferably 20 nm or less, still more preferably 5 nm or less, and most preferably 1 nm or less from a viewpoint of facilitating movement of electrons between the localized state and the contact electrode 12.

Among oxygen atoms contained in the oxygen region 20, the ratio of oxygen atoms each bonded to four carbon atoms is preferably higher than the ratio of oxygen atoms having other bonding states from a viewpoint of forming a sufficient amount of localized state in the oxygen region 20 and stably fixing the Schottky barrier height at a low level. Examples of the other bonding states include a state in which an oxygen atom is present at a carbon site of the crystal structure of silicon carbide. That is, this is a case where one oxygen atom is bonded to four silicon atoms. Examples of the other bonding states further include a state in which an oxygen atom is present between lattices of the crystal structure of silicon carbide. An oxygen atom present between lattices may be called an interstitial oxygen atom. Examples of the other bonding states further include a state in which two oxygen atoms are present in pairs at a carbon site of the crystal structure of silicon carbide.

Among oxygen atoms contained in the oxygen region 20, the ratio of oxygen atoms each bonded to four carbon atoms is preferably higher than the ratio of oxygen atoms each bonded to four silicon atoms from a viewpoint of forming a sufficient amount of localized state in the oxygen region 20. In addition, among oxygen atoms contained in the oxygen region 20, the ratio of oxygen atoms each bonded to four carbon atoms is preferably higher than the ratio of oxygen atoms present between lattices of the crystal structure of silicon carbide. In other word, among oxygen atoms contained in the oxygen region 20, the ratio of oxygen atoms each bonded to four carbon atoms is preferably higher than the ratio of interstitial oxygen atoms. In addition, among oxygen atoms contained in the oxygen region 20, the ratio of oxygen atoms each bonded to four carbon atoms is preferably higher than the ratio of oxygen atoms present in pairs at a carbon site of the crystal structure of silicon carbide.

The n-type impurity concentration in the contact region 18 is preferably $1 \times 10^{19}$ cm$^{-3}$ or more, more preferably $1 \times 10^{20}$ cm$^{-3}$ or more, and still more preferably $5 \times 10^{20}$ cm$^{-3}$ or more from a viewpoint of reducing a contact resistance between the contact electrode 12 and the oxygen region 20. By an increase in the n-type impurity concentration in the contact region 18, electrons easily pass through a Schottky barrier between the contact electrode 12 and the oxygen region 20. Therefore, the contact resistance is further reduced.

The n-type impurity concentration in the contact region 18 is preferably $1\times10^{23}$ cm$^{-3}$ or less, and more preferably $1\times10^{22}$ cm$^{-3}$ or less from a viewpoint of easy formation of the contact region 18.

The n-type impurity concentration in the oxygen region 20 is preferably $1\times10^{19}$ cm$^{-3}$ or more, more preferably $1\times10^{20}$ cm$^{-3}$ or more, and still more preferably $5\times10^{20}$ cm$^{-3}$ or more from a viewpoint of reducing contact resistance between the contact electrode 12 and the oxygen region 20. By an increase in the n-type impurity concentration in the oxygen region 20, electrons easily pass through a Schottky barrier between the contact electrode 12 and the oxygen region 20. Therefore, the contact resistance is further reduced.

The n-type impurity concentration in the oxygen region 20 is preferably $1\times10^{23}$ cm$^{-3}$ or less, and more preferably $1\times10^{22}$ cm$^{-3}$ or less from a viewpoint of easy formation of the oxygen region 20.

In a method for manufacturing the contact structure 100 of the first embodiment, carbon is introduced into the silicon carbide layer 10 by ion implantation in addition to oxygen. Carbon introduced into the silicon carbide layer 10 suppresses entry of an oxygen atom into a carbon site in the crystal structure of silicon carbide during high-temperature annealing to be performed later, and promotes entry of one oxygen atom into a silicon site in the crystal structure of silicon carbide. Therefore, a structure is formed in which one oxygen atom is present at a silicon site of the crystal structure of silicon carbide. For example, among oxygen atoms contained in the oxygen region 20, the ratio of oxygen atoms each bonded to four carbon atoms is higher than the ratio of oxygen atoms each bonded to four silicon atoms.

As illustrated in FIG. 9, the concentration distribution of carbon immediately after ion implantation of oxygen and carbon preferably includes the concentration distribution of oxygen from a viewpoint of increasing the ratio of oxygen atoms each bonded to four carbon atoms among oxygen atoms contained in the oxygen region 20. That is, the concentration of carbon at an arbitrary position in the depth direction immediately after ion implantation of oxygen and carbon is preferably higher than the concentration of oxygen.

Figure 13:
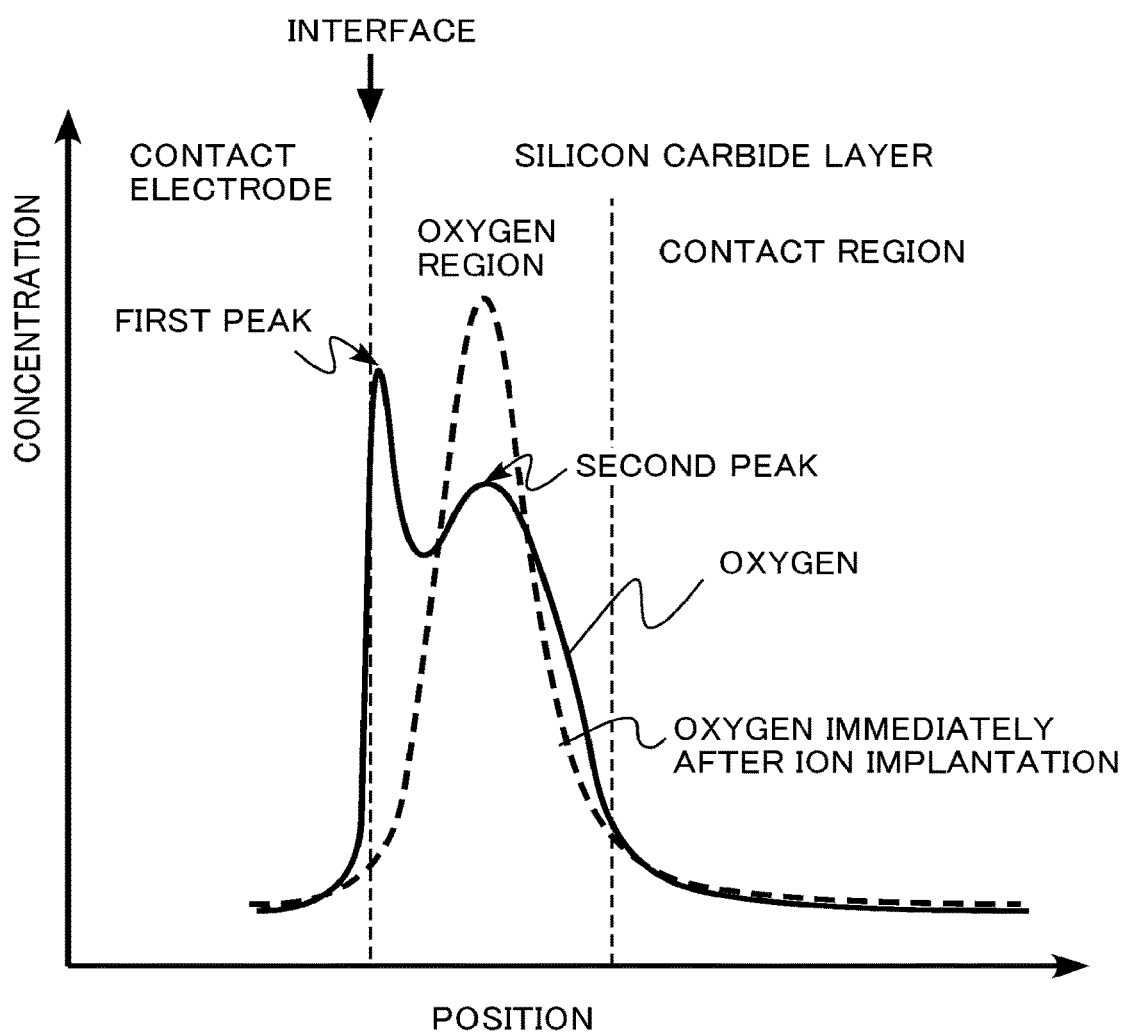
FIG. 13 is an explanatory diagram for functions and effects of the method for manufacturing the semiconductor device of the first embodiment.

FIG. 13 is an explanatory diagram for functions and effects of the method for manufacturing the semiconductor device of the first embodiment. FIG. 13 is a diagram illustrating a concentration distribution of oxygen in the method for manufacturing the semiconductor device of the first embodiment. FIG. 13 illustrates a concentration distribution of oxygen in the contact electrode 12 and the silicon carbide layer 10 in the depth direction. FIG. 13 illustrates a concentration distribution of oxygen in the contact electrode 12, the oxygen region 20, and the contact region 18 in the depth direction.

In FIG. 13, the broken line curve indicates the concentration distribution of oxygen immediately after ion implantation of oxygen. In FIG. 13, the solid line curve indicates the concentration distribution of oxygen after pile-up annealing.

Immediately after ion implantation, a peak in the concentration distribution of oxygen is formed at a depth position determined by accelerating voltage of the ion implantation. Then, by performing high-temperature annealing before forming the contact electrode 12, oxygen diffuses toward a front surface side and a back surface side of the silicon carbide layer 10.

Then, by performing pile-up annealing after forming the contact electrode 12, oxygen is piled up at an interface between the contact electrode 12 and the oxygen region 20. This is because the structure in which a silicon site is replaced with one oxygen atom becomes energetically more stable due to approach to the contact electrode 12. The structure in which a silicon site is replaced with one oxygen atom becomes energetically more stable because movement of electrons between the contact electrode 12 and the localized state becomes easy due to approach to the contact electrode 12.

By inclusion of the oxygen region 20 in the contact structure 100 of the first embodiment, the Schottky barrier height is fixed at a low level. Therefore, the contact resistance of the contact structure 100 is reduced, and ohmic characteristics can be achieved. In addition, variation in the Schottky barrier height of the contact resistance of the contact structure 100 is suppressed, and variation in the contact resistance is suppressed.

By inclusion of the oxygen region 20 in the contact structure 100 of the first embodiment, the Schottky barrier height is fixed at a level less than 0.15 eV regardless of a material of the contact electrode 12. Therefore, the material of the contact electrode 12 can be arbitrarily selected. Therefore, the degree of freedom in the structural design and manufacturing process of the contact structure 100 is increased.

As described above, according to the first embodiment, it is possible to achieve a semiconductor device that suppresses variation in contact resistance.

Second Embodiment

A semiconductor device of a second embodiment includes a first electrode; a second electrode; a silicon carbide layer having a first plane in contact with the first electrode and a second plane facing the first plane and in contact with the second electrode, the silicon carbide layer includes a first silicon carbide region of n-type; a second silicon carbide region of n-type disposed between the first plane and the first silicon carbide region, n-type impurity concentration of the second silicon carbide region being lower than n-type impurity concentration of the first silicon carbide region; a third silicon carbide region of p-type disposed between the first plane and the second silicon carbide region; a fourth silicon carbide region of n-type disposed between the first plane and the third silicon carbide region; a fifth silicon carbide region of p-type provided between the first electrode and the third silicon carbide region, the fifth silicon carbide region being in contact with the first electrode, and p-type impurity concentration of the fifth silicon carbide region being higher than p-type impurity concentration of the third silicon carbide region; and a sixth silicon carbide region provided between the first electrode and the fourth silicon carbide region, the sixth silicon carbide region being in contact with the first electrode, and the sixth silicon carbide region containing at least one oxygen atom bonded to four carbon atoms; a gate electrode disposed on a side of the first electrode of the silicon carbide layer; and a gate insulating layer disposed between the gate electrode and the third silicon carbide region. Hereinafter, descriptions overlapping with the first embodiment will be partially omitted.

Figure 14:
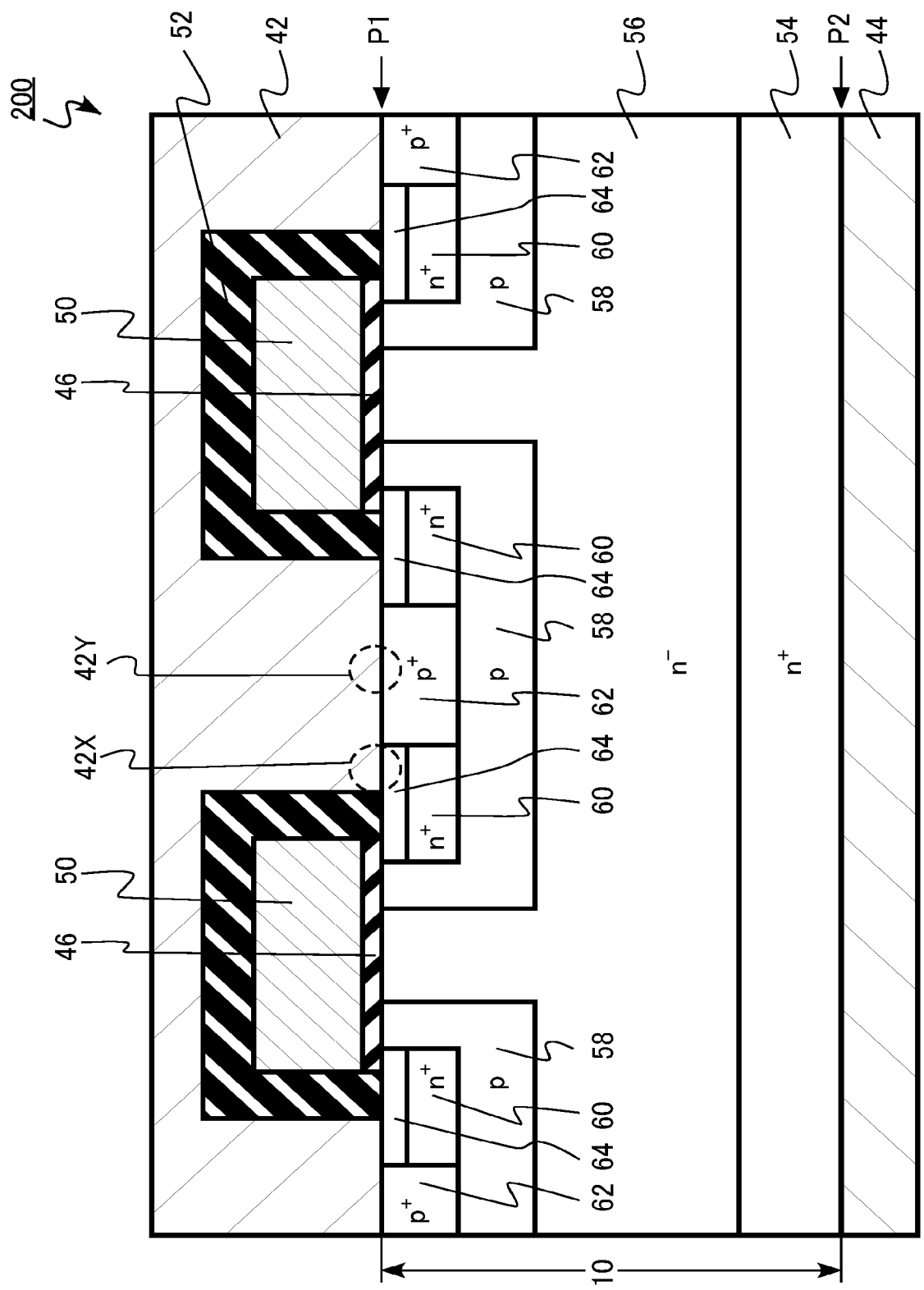
FIG. 14 is a schematic cross sectional view of a semiconductor device of a second embodiment.

FIG. 14 is a schematic cross-sectional view of the semiconductor device of the second embodiment. The semiconductor device of the second embodiment is a planar gate type vertical MOSFET 200. The MOSFET 200 is an n-channel type transistor using electrons as carriers.

In the MOSFET 200, a contact structure between a source electrode 42 and a source region 60 of n⁺ type is similar to the contact structure 100 of the first embodiment.

The MOSFET 200 includes a silicon carbide layer 10, the source electrode 42 (first electrode), a drain electrode 44 (second electrode), a gate insulating layer 46, a gate electrode 50, and an interlayer insulating layer 52. The source electrode 42 has the first portion 42X and the second portion 42Y.

The source electrode 42 is an example of the first electrode. The drain electrode 44 is an example of the second electrode.

The silicon carbide layer 10 includes a drain region 54 (first silicon carbide region), a drift region 56 (second silicon carbide region), a p-well region 58 (third silicon carbide region), a source region 60 (fourth silicon carbide region), a p-well contact region 62 (fifth silicon carbide region), and a first oxygen region 64 (sixth silicon carbide region).

The silicon carbide layer 10 is made of, for example, a single crystal of 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

The silicon carbide layer 10 is disposed between the source electrode 42 and the drain electrode 44.

Here, the term "depth" means a distance from the first plane P1 in a direction going from the first plane P1 to the second plane P2.

The drain region 54 is made of SiC of n⁺ type. The drain region 54 contains, for example, nitrogen (N) as n-type impurities. The n-type impurity concentration in the drain region 54 is, for example, $1 \times 10^{19}$ cm⁻³ or more and $1 \times 10^{23}$ cm⁻³ or less.

The drift region 56 is made of SiC of n⁻ type. The drift region 56 is disposed between the drain region 54 and the source electrode 42. The drift region 56 is disposed between the first plane P1 and the drain region 54. A part of the drift region 56 is in contact with the first plane P1.

The drift region 56 contains, for example, nitrogen (N) as n-type impurities. The n-type impurity concentration in the drift region 56 is, for example, $1 \times 10^{15}$ cm⁻³ or more and $2 \times 10^{16}$ cm⁻³ or less. The n-type impurity concentration in the drift region 56 is lower than the n-type impurity concentration in the drain region 54. For example, the drift region 56 is a SiC epitaxial growth layer formed on the drain region 54 by epitaxial growth. The drift region 56 has a thickness, for example, of 5 µm or more and 100 µm or less.

The p-well region 58 is made of SiC of p-type. The p-well region 58 is disposed between the drift region 56 and the source electrode 42. The p-well region 58 is disposed between the first plane P1 and the drift region 56. A part of the p-well region 58 is in contact with the first plane P1.

The p-well region 58 contains, for example, aluminum (Al) as p-type impurities. The p-type impurity concentration in the p-well region 58 is, for example, $1 \times 10^{16}$ cm⁻³ or more and $1 \times 10^{20}$ cm⁻³ or less.

The p-well region 58 has a depth, for example, of 0.4 µm or more and 0.8 µm or less. The p-well region 58 functions as a channel region of the MOSFET 200.

The source region 60 is made of SiC of n⁺ type. The source region 60 is disposed between the source electrode 42 and the p-well region 58. The source region 60 is disposed between the first plane P1 and the p-well region 58.

The source region 60 contains phosphorus (P) or nitrogen (N) as an n-type impurity. The n-type impurity concentration in the source region 60 is, for example, $1 \times 10^{19}$ cm⁻³ or more and $1 \times 10^{23}$ cm⁻³ or less. The n-type impurity concentration in the source region 60 is higher than the n-type impurity concentration in the drift region 56.

The depth of the source region 60 is shallower than the depth of the p-well region 58. The depth of the source region 60 is, for example, 0.1 µm or more and 0.4 µm or less.

The p-well contact region 62 is made of SiC of p⁺ type. The p-well contact region 62 is disposed between the source electrode 42 and the p-well region 58. The p-well contact region 62 is disposed between the p-well region 58 and the first plane P1. The p-well contact region 62 is adjacent to the source region 60.

The p-well contact region 62 contains, for example, aluminum as p-type impurities. The p-type impurity concentration in the p-well contact region 62 is, for example, $1 \times 10^{18}$ cm⁻³ or more and $1 \times 10^{22}$ cm⁻³ or less.

The p-type impurity concentration in the p-well contact region 62 is higher than the p-type impurity concentration in the p-well region 58.

The depth of the p-well contact region 62 is shallower than the depth of the p-well region 58. The depth of the p-well contact region 62 is, for example, 0.1 µm or more and 0.4 µm or less.

The first oxygen region 64 is made of SiC of type. The first oxygen region 64 is disposed between the source electrode 42 and the source region 60. The first oxygen region 64 is disposed between the source region 60 and the first plane P1. The first oxygen region 64 is in contact with the source electrode 42.

The first oxygen region 64 contains oxygen as impurities. The maximum concentration of oxygen in the first oxygen region 64 is, for example, $1 \times 10^{17}$ cm⁻³ or more and $1 \times 10^{23}$ cm⁻³ or less.

The first oxygen region 64 contains at least one oxygen atom bonded to four carbon atoms. The first oxygen region 64 may contain oxygen atoms each bonded to four carbon atoms.

The first oxygen region 64 contains, for example, phosphorus (P) or nitrogen (N) as n-type impurities. The n-type impurity concentration in the first oxygen region 64 is, for example, $1 \times 10^{19}$ cm⁻³ or more and $1 \times 10^{23}$ cm⁻³ or less.

The concentration distribution of oxygen in the source electrode 42 and the first oxygen region 64 has a first peak. A distance between an interface between the source electrode 42 and the first oxygen region 64 and the first peak is 50 nm or less. In the first oxygen region 64, oxygen is piled up at an interface between the source electrode 42 and the first oxygen region 64.

The oxygen concentration at the first peak is, for example, $1 \times 10^{17}$ cm⁻³ or more and $1 \times 10^{23}$ cm⁻³ or less.

The concentration distribution of oxygen in the source electrode 42 and the first oxygen region 64 has a second peak between the first peak and the source region 60. The oxygen concentration at the second peak is lower than, for example, the oxygen concentration at the first peak.

The gate insulating layer 46 is disposed between the silicon carbide layer 10 and the gate electrode 50. The gate insulating layer 46 is disposed between the gate electrode 50 and the p-well region 58.

The gate insulating layer 46 is made of, for example, an oxide or an oxynitride. The gate insulating layer 46 is made of, for example, silicon oxide. The gate insulating layer 46 has a thickness, for example, of 30 nm or more and 100 nm or less.

The gate insulating layer 46 is in contact with the p-well region 58. The p-well region 58 near the gate insulating layer 46 functions as the channel region of the MOSFET 200.

The gate electrode 50 is disposed on a side of the first plane P1 of the silicon carbide layer 10. The gate electrode 50 is provided on the gate insulating layer 46. The gate insulating layer 46 is sandwiched between the gate electrode 50 and the drift region 56, the source region 60, and the p-well region 58.

The gate electrode 50 is a conductor. The gate electrode 50 is made of, for example, polycrystalline silicon containing n-type impurities or p-type impurities. The gate electrode 50 may be made of, for example, a metal such as titanium nitride, tungsten nitride, tungsten, aluminum, copper, ruthenium, cobalt, nickel, cobalt silicide, or nickel silicide. The gate electrode 50 may have a stacked structure of any one of the above metals and polycrystalline silicon containing n-type impurities or p-type impurities.

The interlayer insulating layer 52 is formed on the gate electrode 50. The interlayer insulating layer 52 electrically separates the gate electrode 50 from the source electrode 42. The interlayer insulating layer 52 is made of, for example, silicon oxide.

The source electrode 42 is disposed on a side of the first plane P1 of the silicon carbide layer 10. The source electrode 42 is electrically connected to the first oxygen region 64 and the p-well contact region 62. The source electrode 42 is in contact with the first oxygen region 64 and the p-well contact region 62. The source electrode 42 also functions as a p-well electrode that applies an electric potential to the p-well region 58.

The source electrode 42 is in ohmic-contact with the first oxygen region 64. The source electrode 42 is in ohmic-contact with the p-well contact region 62.

The source electrode 42 is made of a conductor. The source electrode 42 is made of, for example, a metal, an intermetallic compound, a metal nitride, a metal silicide, or a semiconductor.

The source electrode 42 may have, for example, a stacked structure. The source electrode 42 has, for example, a stacked structure of two different types of metals. The source electrode 42 has, for example, a stacked structure of a metal silicide and a metal.

The source electrode 42 has, for example, a stacked structure of titanium and aluminum. The source electrode 42 contains, for example, nickel silicide. The source electrode 42 has, for example, a stacked structure of nickel silicide and aluminum.

The source electrode 42 has the first portion 42X and the second portion 42Y. The first portion 42X is in contact with the first oxygen region 64. The second portion 42Y is in contact with the p-well contact region 62. The first portion 42X and the second portion 42Y are made of, for example, the same material. The first portion 42X and the second portion 42Y have, for example, substantially same chemical composition.

The drain electrode 44 is disposed on a side of the second plane P2 of the silicon carbide layer 10. The drain electrode 44 is in contact with the drain region 54. The drain electrode 44 is electrically connected to the drain region 54.

The drain electrode 44 is made of a conductor. The drain electrode 44 is made of, for example, a metal, an intermetallic compound, a metal nitride, a metal silicide, or a semiconductor.

The drain electrode 44 is made of, for example, nickel. Nickel may react with the silicon carbide layer 10 to form nickel silicide. Nickel silicide is, for example, NiSi or Ni$_2$Si.

Hereinafter, functions and effects of the semiconductor device of the second embodiment will be described.

The MOSFET 200 of the second embodiment includes the first oxygen region 64 between the source electrode 42 and the source region 60. The first oxygen region 64 contains one oxygen atom bonded to four carbon atoms. By inclusion of the first oxygen region 64 in the MOSFET 200, the contact resistance between the source electrode 42 and the source region 60 is reduced and stabilized.

Both a contact between the first portion 42X of the source electrode 42 and the source region 60 and a contact between the second portion 42Y of the source electrode 42 and the p-well contact region 62 are preferably ohmic contacts from a viewpoint of reducing on-resistance and stabilizing the operation of the MOSFET. For example, it is considered that by applying materials with different work functions to the first portion 42X and the second portion 42Y, both a contact to the source region 60 of type and a contact to the p-well contact region 62 of type are made ohmic contacts. However, this method complicates the structure of the MOSFET and also complicates a manufacturing process.

By inclusion of the first oxygen region 64 in the MOSFET 200, the first portion 42X of the source electrode 42 is in ohmic-contact with the first oxygen region 64 regardless of a material of the first portion 42X. Therefore, an optimum material of the source electrode 42 can be selected such that the second portion 42Y is in ohmic-contact with the p-well contact region 62.

That is, the first portion 42X and the second portion 42Y can be made of the same material. Therefore, it is not necessary to adopt a complicated structure such as a structure in which different materials are applied to the first portion 42X and the second portion 42Y. In addition, since the first portion 42X and the second portion 42Y can be made of the same material, a manufacturing process is also simplified. Therefore, it is possible to achieve the MOSFET 200 having a simple device structure and manufactured by a simple manufacturing process.

A maximum concentration of oxygen in the first oxygen region 64 is preferably $1 \times 10^{17}$ cm$^{-3}$ or more, more preferably $2 \times 10^{18}$ cm$^{-3}$ or more, still more preferably $3 \times 10^{19}$ cm$^{-3}$ or more, and most preferably $3 \times 10^{20}$ cm$^{-3}$ or more from a viewpoint of forming a sufficient amount of localized state in the first oxygen region 64 and stably fixing the Schottky barrier height in low level.

The concentration distribution of oxygen in the source electrode 42 and the first oxygen region 64 has a first peak. The oxygen concentration at the first peak is preferably $1 \times 10^{17}$ cm$^{-3}$ or more, more preferably $2 \times 10^{18}$ cm$^{-3}$ or more, still more preferably $3 \times 10^{19}$ cm$^{-3}$ or more, and most preferably $3 \times 10^{20}$ cm$^{-3}$ or more.

A maximum concentration of oxygen in the first oxygen region 64 is preferably $1 \times 10^{23}$ cm$^{-3}$ or less, more preferably $5 \times 10^{22}$ cm$^{-3}$ or less, still more preferably $1 \times 10^{22}$ cm$^{-3}$ or less, and most preferably $5 \times 10^{21}$ cm$^{-3}$ or less from a viewpoint of easy formation of the first oxygen region 64.

A distance between an interface between the source electrode 42 and the first oxygen region 64 and the first peak is preferably 50 nm or less, more preferably 20 nm or less, still more preferably 5 nm or less, and most preferably 1 nm or less from a viewpoint of facilitating movement of electrons between the localized state and the source electrode 42.

Among oxygen atoms contained in the first oxygen region 64, the ratio of oxygen atoms each bonded to four carbon atoms is preferably higher than the ratio of oxygen atoms each bonded to four silicon atoms from a viewpoint of forming a sufficient amount of localized state in the first oxygen region 64. In addition, among oxygen atoms contained in the first oxygen region 64, the ratio of oxygen atoms each bonded to four carbon atoms is preferably higher than the ratio of oxygen atoms present between lattices of the crystal structure of silicon carbide. In addition, among oxygen atoms contained in the first oxygen region 64, the ratio of oxygen atoms each bonded to four carbon atoms is preferably higher than the ratio of oxygen atoms present in pairs at a carbon site of the crystal structure of silicon carbide.

The n-type impurity concentration in the source region 60 is preferably $1\times10^{19}$ cm$^{-3}$ or more, more preferably $1\times10^{20}$ cm$^{-3}$ or more, and still more preferably $5\times10^{20}$ cm$^{-3}$ or more from a viewpoint of reducing contact resistance between the source electrode 42 and the first oxygen region 64. By an increase in the n-type impurity concentration in the source region 60, electrons easily pass through a Schottky barrier between the source electrode 42 and the first oxygen region 64. Therefore, the contact resistance is further reduced.

The n-type impurity concentration in the source region 60 is preferably $1\times10^{23}$ cm$^{-3}$ or less, and more preferably $1\times10^{22}$ cm$^{-3}$ or less from a viewpoint of facilitating formation of the source region 60.

The n-type impurity concentration in the first oxygen region 64 is preferably $1\times10^{19}$ cm$^{-3}$ or more, more preferably $1\times10^{20}$ cm$^{-3}$ or more, and still more preferably $5\times10^{20}$ cm$^{-3}$ or more from a viewpoint of reducing contact resistance between the source electrode 42 and the first oxygen region 64. By an increase in the n-type impurity concentration in the first oxygen region 64, electrons easily pass through a Schottky barrier between the source electrode 42 and the first oxygen region 64. Therefore, the contact resistance is further reduced.

The n-type impurity concentration in the first oxygen region 64 is preferably $1\times10^{23}$ cm$^{-3}$ or less, and more preferably $1\times10^{22}$ cm$^{-3}$ or less from a viewpoint of facilitating formation of the first oxygen region 64.

As described above, according to the second embodiment, it is possible to achieve a semiconductor device that suppresses variation in contact resistance.

Third Embodiment

A semiconductor device of a third embodiment is different from the semiconductor device of the second embodiment in further including a seventh silicon carbide region provided between a second electrode and a first silicon carbide region, in contact with the second electrode, and containing at least one oxygen atom bonded to four carbon atoms. Hereinafter, descriptions overlapping with the first or second embodiment will be partially omitted.

Figure 15:
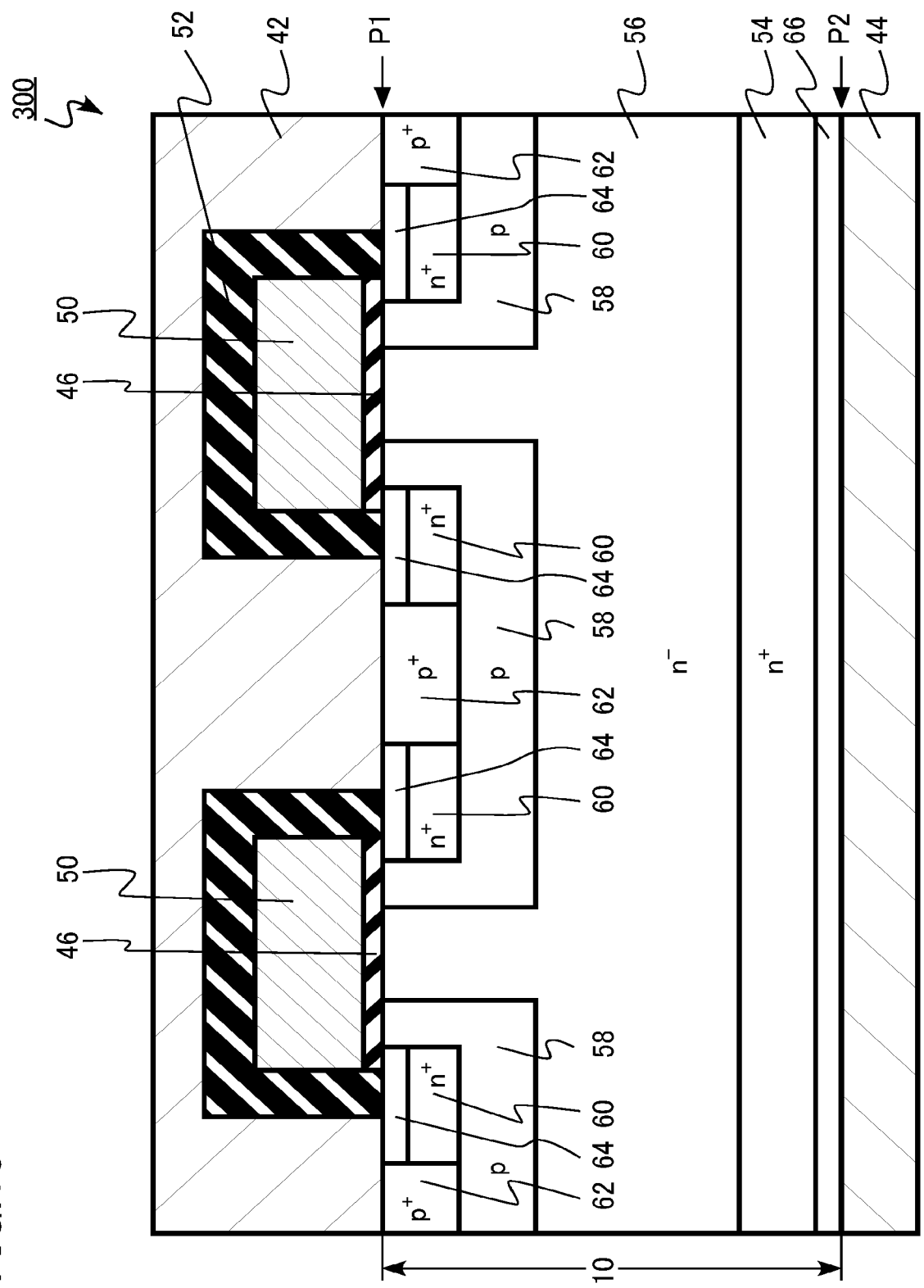
FIG. 15 is a schematic cross sectional view of a semiconductor device of a third embodiment.

FIG. 15 is a schematic cross-sectional view of the semiconductor device of the third embodiment. The semiconductor device of the third embodiment is a planar gate type vertical MOSFET 300. The MOSFET 300 is an n-channel type transistor using electrons as carriers.

In the MOSFET 300, a contact structure between a source electrode 42 and a source region 60 of n$^+$ type is similar to the contact structure 100 of the first embodiment. In the MOSFET 300, a contact structure between a drain electrode 44 and a drain region 54 of n$^+$ type is similar to the contact structure 100 of the first embodiment.

The MOSFET 300 includes a silicon carbide layer 10, a source electrode 42 (first electrode), a drain electrode (second electrode), a gate insulating layer 46, a gate electrode 50, and an interlayer insulating layer 52.

The source electrode 42 is an example of the first electrode. The drain electrode 44 is an example of the second electrode.

The silicon carbide layer 10 includes a drain region 54 (first silicon carbide region), a drift region 56 (second silicon carbide region), a p-well region 58 (third silicon carbide region), the source region 60 (fourth silicon carbide region), a p-well contact region 62 (fifth silicon carbide region), a first oxygen region 64 (sixth silicon carbide region), and a second oxygen region 66 (seventh silicon carbide region).

The second oxygen region 66 is made of SiC of type. The second oxygen region 66 is disposed between the drain electrode 44 and the drain region 54. The second oxygen region 66 is disposed between the drain region 54 and a second plane P2. The second oxygen region 66 is in contact with the drain electrode 44.

The second oxygen region 66 contains oxygen as impurities. A maximum concentration of oxygen in the second oxygen region 66 is, for example, $1\times10^{17}$ cm$^{-3}$ or more and $1\times10^{23}$ cm$^{-3}$ or less.

The second oxygen region 66 contains at least one oxygen atom bonded to four carbon atoms. The second oxygen region 66 may contain oxygen atoms each bonded to four carbon atoms.

The second oxygen region 66 contains, for example, nitrogen (N) as n-type impurities. The n-type impurity concentration in the first oxygen region 64 is, for example, $1\times10^{19}$ cm$^{-3}$ or more and $1\times10^{23}$ cm$^{-3}$ or less.

The MOSFET 300 of the third embodiment includes the second oxygen region 66 between the drain electrode 44 and the drain region 54. The second oxygen region 66 contains one oxygen atom bonded to four carbon atoms. By inclusion of the second oxygen region 66 in the MOSFET 300, the contact resistance between the drain electrode 44 and the drain region 54 is reduced and stabilized.

As described above, according to the third embodiment, it is possible to achieve a semiconductor device that suppresses variation in contact resistance.

Fourth Embodiment

A semiconductor device of a fourth embodiment is different from the semiconductor device of the second embodiment in that a first electrode has a metal silicide portion disposed in a silicon carbide layer. Hereinafter, descriptions overlapping with the first or second embodiment will be partially omitted.

Figure 16:
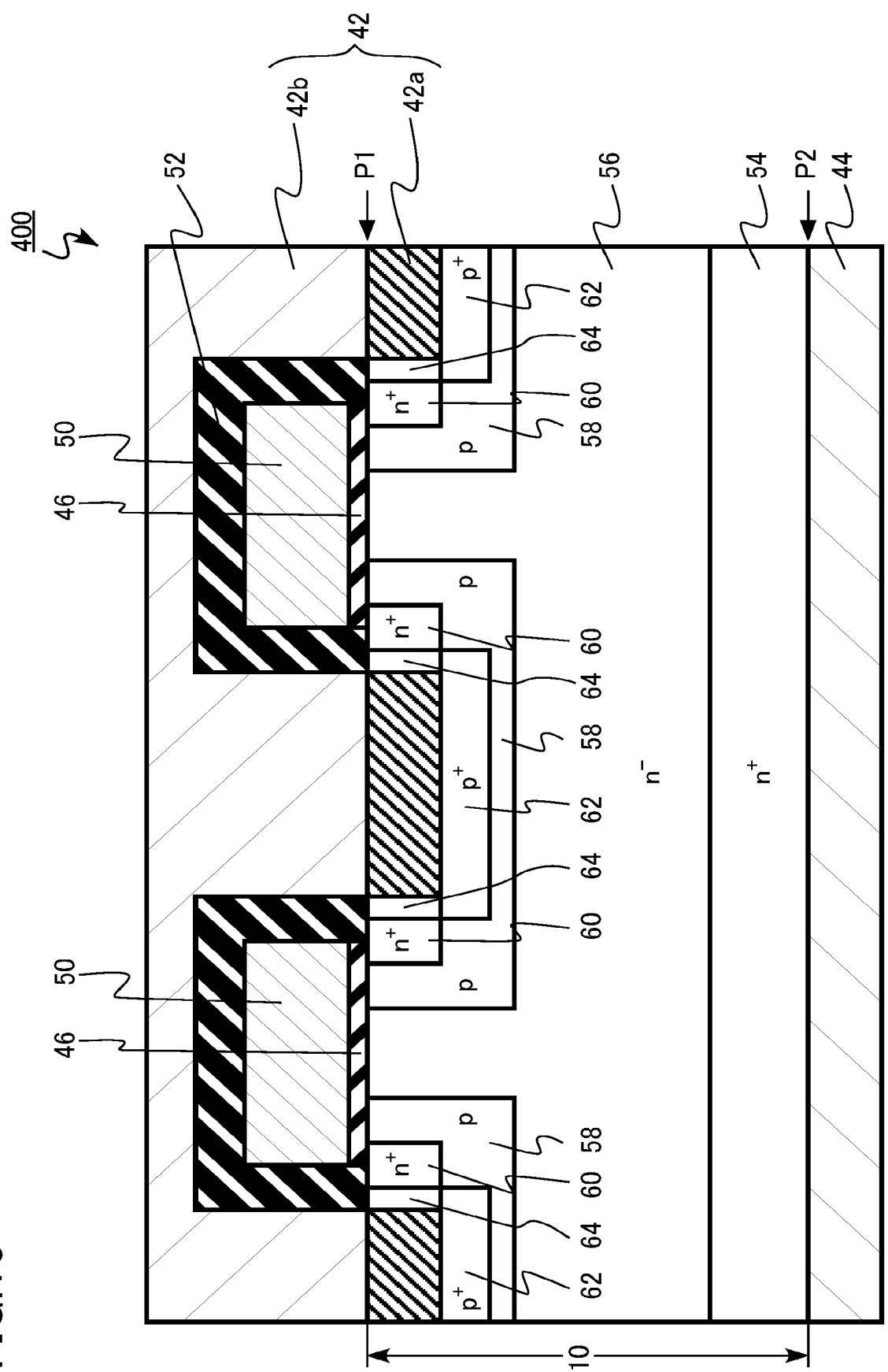
FIG. 16 is a schematic cross sectional view of a semiconductor device of a fourth embodiment.

FIG. 16 is a schematic cross-sectional view of the semiconductor device of the fourth embodiment. The semiconductor device of the fourth embodiment is a planar gate type vertical MOSFET 400. The MOSFET 400 is an n-channel type transistor using electrons as carriers.

In the MOSFET 400, a contact structure between a source electrode and a source region of n$^+$ type is similar to the contact structure 100 of the first embodiment.

The MOSFET 400 includes a silicon carbide layer 10, a source electrode 42 (first electrode), a drain electrode (second electrode), a gate insulating layer 46, a gate electrode 50, and an interlayer insulating layer 52. The source electrode 42 has a metal silicide portion 42a and a metal portion 42b.

The source electrode 42 is an example of the first electrode. The drain electrode 44 is an example of the second electrode.

The silicon carbide layer 10 includes a drain region 54 (first silicon carbide region), a drift region 56 (second silicon carbide region), a p-well region 58 (third silicon carbide region), a source region 60 (fourth silicon carbide region), a p-well contact region 62 (fifth silicon carbide region), and a first oxygen region 64 (sixth silicon carbide region).

The source electrode 42 has a metal silicide portion 42a and a metal portion 42b. The metal silicide portion 42a is disposed in the silicon carbide layer 10. The metal silicide portion 42a is embedded in the silicon carbide layer 10.

The metal silicide portion 42a contains a metal silicide. The metal silicide portion 42a contains, for example, nickel silicide.

The metal portion 42b contains a metal, an intermetallic compound, or a metal nitride. The metal portion 42b has, for example, a stacked structure of titanium and aluminum.

The metal silicide portion 42a is in contact with the first oxygen region 64. The metal silicide portion 42a is in contact with the p-well contact region 62.

The MOSFET 400 of the fourth embodiment includes the first oxygen region 64 between the metal silicide portion 42a of the source electrode 42 and the source region 60. The first oxygen region 64 contains at least one one oxygen atom bonded to four carbon atoms. By inclusion of the first oxygen region 64 in the MOSFET 400, the contact resistance between the source electrode 42 and the source region 60 is reduced and stabilized.

As described above, according to the fourth embodiment, it is possible to achieve a semiconductor device that suppresses variation in contact resistance.

Fifth Embodiment

An inverter circuit and a drive device of a fifth embodiment are an inverter circuit and a drive device each including the semiconductor device of the second embodiment.

Figure 17:
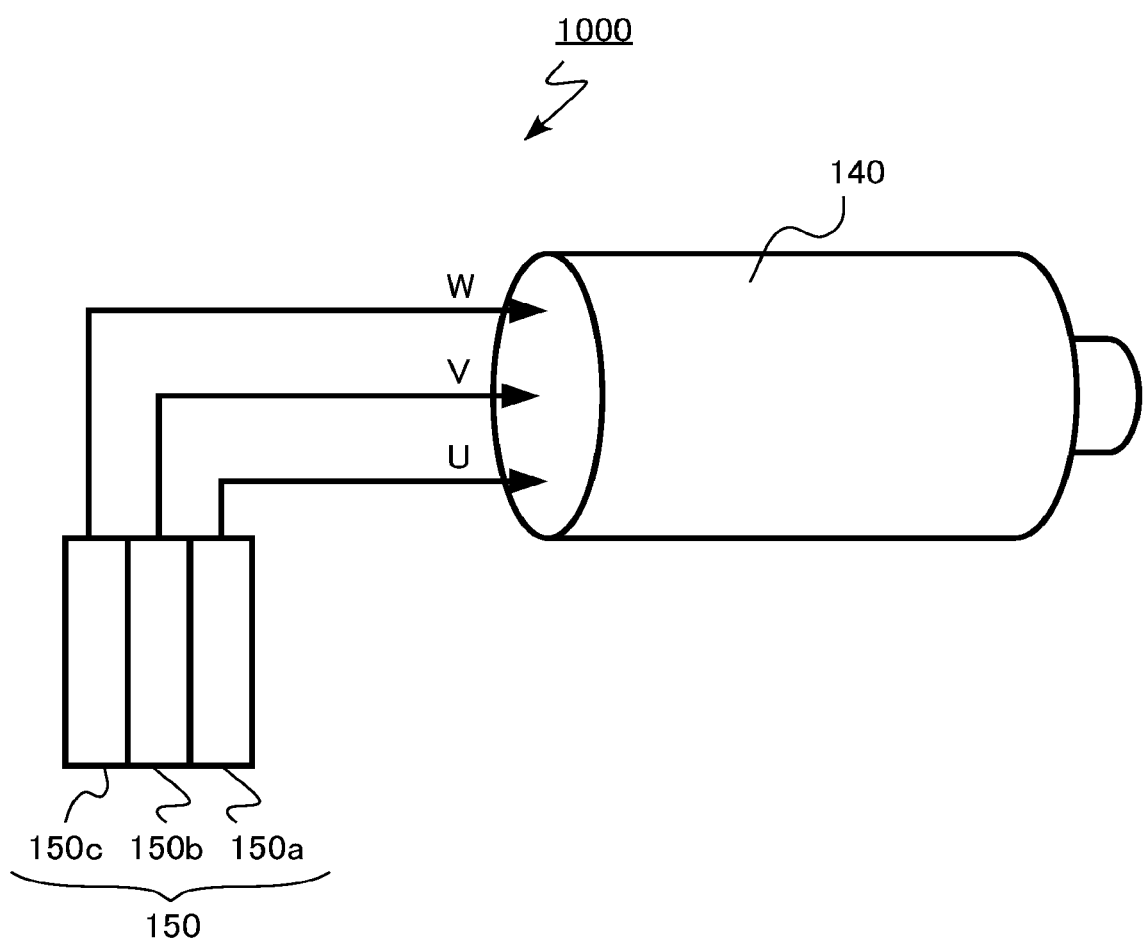
FIG. 17 is a schematic view of a drive device of a fifth embodiment.

FIG. 17 is a schematic view of the drive device of the fifth embodiment. A drive device 1000 includes a motor 140 and an inverter circuit 150.

The inverter circuit 150 includes three semiconductor modules 150a, 150b, and 150c each including the MOSFET 200 of the second embodiment as a switching element. By connecting the three semiconductor modules 150a, 150b, and 150c in parallel, the three-phase inverter circuit 150 having three AC voltage output terminals U, V, and W is achieved. The motor 140 is driven by AC voltage output from the inverter circuit 150.

According to the fifth embodiment, by inclusion of the MOSFET 200 with improved characteristics, the characteristics of the inverter circuit 150 and the drive device 1000 are improved.

Sixth Embodiment

A vehicle of a sixth embodiment is a vehicle including the semiconductor device of the second embodiment.

Figure 18:
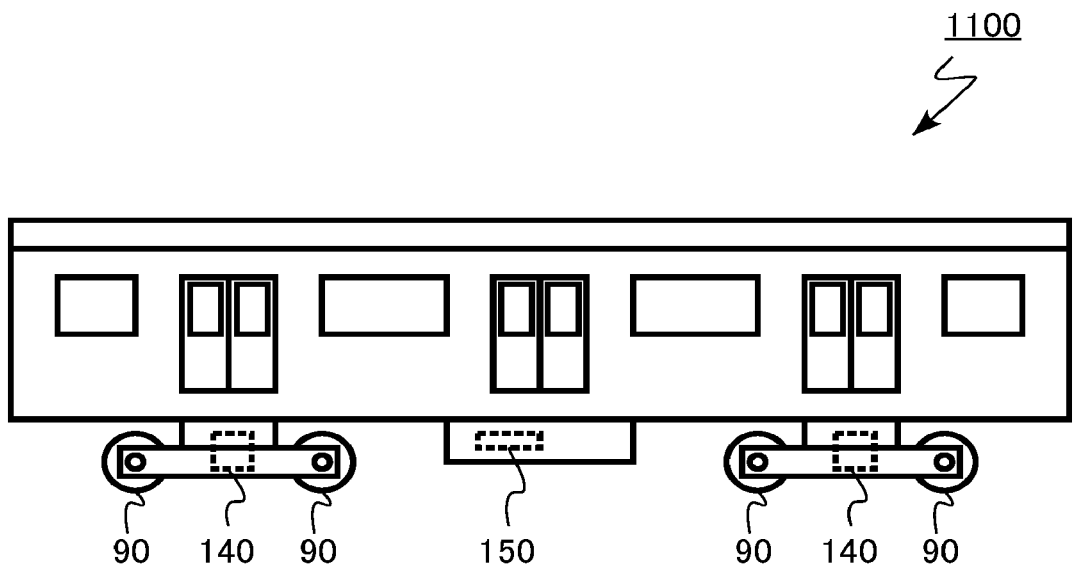
FIG. 18 is a schematic view of a vehicle of a sixth embodiment.

FIG. 18 is a schematic view of the vehicle of the sixth embodiment. A vehicle 1100 of the sixth embodiment is a railroad vehicle. The vehicle 1100 includes a motor 140 and an inverter circuit 150.

The inverter circuit 150 includes three semiconductor modules each including the MOSFET 200 of the second embodiment as a switching element. By connecting the three semiconductor modules in parallel, the three-phase inverter circuit 150 having three AC voltage output terminals U, V, and W is achieved. The motor 140 is driven by AC voltage output from the inverter circuit 150. The motor 140 rotates wheels 90 of the vehicle 1100.

According to the sixth embodiment, by inclusion of the MOSFET 200 with improved characteristics, the characteristics of the vehicle 1100 are improved.

Seventh Embodiment

A vehicle of a seventh embodiment is a vehicle including the semiconductor device of the second embodiment.

Figure 19:
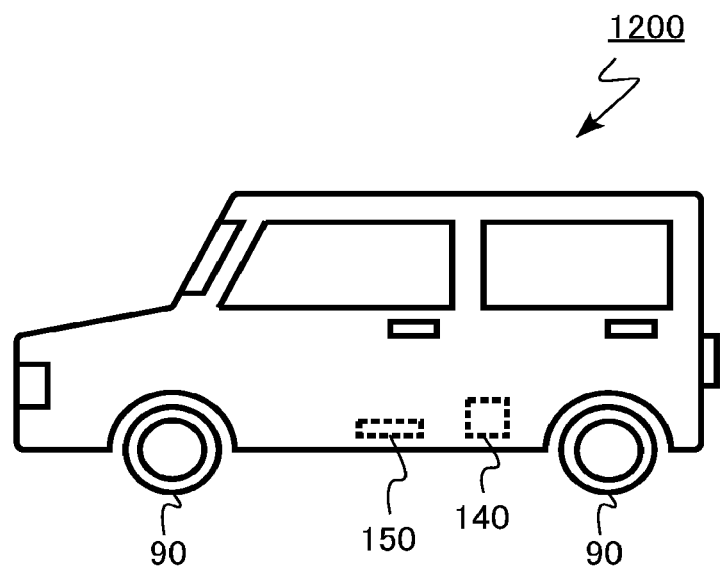
FIG. 19 is a schematic view of a vehicle of a seventh embodiment.

FIG. 19 is a schematic view of the vehicle of the seventh embodiment. A vehicle 1200 of the seventh embodiment is an automobile. The vehicle 1200 includes a motor 140 and an inverter circuit 150.

The inverter circuit 150 includes three semiconductor modules each including the MOSFET 200 of the second embodiment as a switching element. By connecting the three semiconductor modules in parallel, the three-phase inverter circuit 150 having three AC voltage output terminals U, V, and W is achieved.

The motor 140 is driven by AC voltage output from the inverter circuit 150. The motor 140 rotates wheels 90 of the vehicle 1200.

According to the seventh embodiment, by inclusion of the MOSFET 200 with improved characteristics, the characteristics of the vehicle 1200 are improved.

Eighth Embodiment

An elevator of an eighth embodiment is an elevator including the semiconductor device of the second embodiment.

Figure 20:
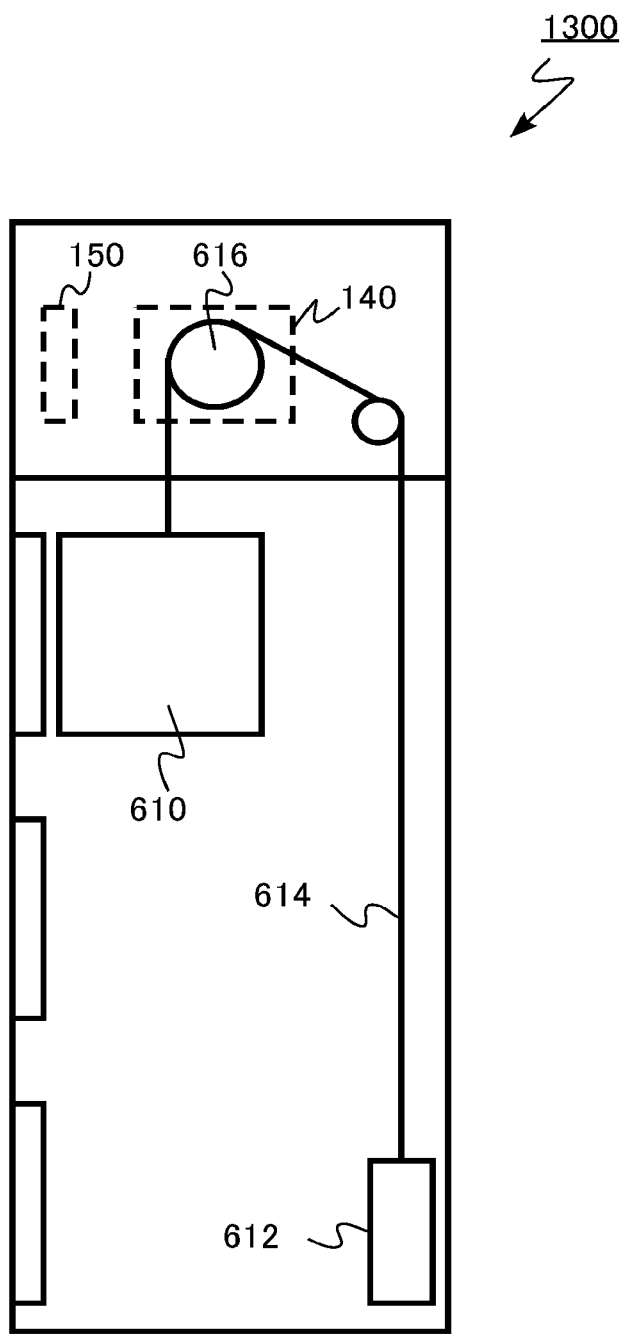
FIG. 20 is a schematic view of an elevator of an eighth embodiment.

FIG. 20 is a schematic view of the elevator of the eighth embodiment. An elevator 1300 of the eighth embodiment includes a car 610, a counterweight 612, a wire rope 614, a hoisting machine 616, a motor 140, and an inverter circuit 150.

The inverter circuit 150 includes three semiconductor modules each including the MOSFET 200 of the second embodiment as a switching element. By connecting the three semiconductor modules in parallel, the three-phase inverter circuit 150 having three AC voltage output terminals U, V, and W is achieved.

The motor 140 is driven by AC voltage output from the inverter circuit 150. The motor 140 rotates the hoisting machine 616, and the car 610 moves up and down.

According to the eighth embodiment, by inclusion of the MOSFET 200 with improved characteristics, the characteristics of the elevator 1300 are improved.

As described above, in the first to fourth embodiments, the case of silicon carbide having a crystal structure of 4H—SiC has been exemplified, but the present disclosure can also be applied to silicon carbide having a crystal structure of 3C—SiC or 6H—SiC.

In the second to fourth embodiments, the case where the contact structure of the first embodiment is applied to the MOSFET has been exemplified, but the contact structure of the first embodiment can also be applied to other semiconductor devices. For example, the contact structure of the first embodiment can be applied to a diode or an insulated gate bipolar transistor (IGBT).

Note that in the first to fourth embodiments, the case where nitrogen or phosphorus is used as n-type impurities has been exemplified, but arsenic (As) or antimony (Sb) can also be applied as n-type impurities.

In addition, in the first to fourth embodiments, the case where aluminum or boron is used as p-type impurities has been exemplified, but gallium (Ga) or indium (In) can also be applied as p-type impurities.

In addition, in the fifth to eighth embodiments, the case where the semiconductor device of the present disclosure is applied to a vehicle or an elevator has been exemplified, but the semiconductor device of the present disclosure can also be applied to, for example, a power conditioner of a photovoltaic power generation system.

In addition, in the fifth to eighth embodiments, the case where the semiconductor device of the second embodiment is applied has been exemplified, but for example, the semiconductor device of the third or fourth embodiment can also be applied.

While certain embodiments have been described, these embodiments have been presented by way of example only, and are not intended to limit the scope of the inventions. Indeed, the semiconductor device, the method for manufacturing a semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   an electrode; and
   a silicon carbide layer in contact with the electrode and including:
   a first silicon carbide region of n-type; and
   a second silicon carbide region disposed between the first silicon carbide region and the electrode, the second silicon carbide region being in contact with the electrode, and the second silicon carbide region containing at least one oxygen atom bonded to four carbon atoms.

2. The semiconductor device according to claim 1, wherein a maximum concentration of oxygen in the second silicon carbide region is $1\times10^{17}$ cm$^{-3}$ or more and $1\times10^{23}$ cm$^{-3}$ or less.

3. The semiconductor device according to claim 1, wherein a concentration distribution of oxygen in the electrode and the second silicon carbide region has a first peak, and a distance between an interface between the electrode and the second silicon carbide region and the first peak is 50 nm or less.

4. The semiconductor device according to claim 3, wherein a concentration distribution of oxygen in the electrode and the second silicon carbide region has a second peak between the first peak and the first silicon carbide region.

5. The semiconductor device according to claim 1, wherein an n-type impurity concentration in the first silicon carbide region is $1\times10^{19}$ cm$^{-3}$ or more and $1\times10^{23}$ cm$^{-3}$ or less.

6. The semiconductor device according to claim 1, wherein among oxygen atoms contained in the second silicon carbide region, a ratio of oxygen atoms each bonded to four carbon atoms is higher than a ratio of oxygen atoms each bonded to four silicon atoms.

7. An inverter circuit comprising the semiconductor device according to claim 1.

8. A drive device comprising the semiconductor device according to claim 1.

9. A vehicle comprising the semiconductor device according to claim 1.

10. An elevator comprising the semiconductor device according to claim 1.

* * * * *